United States Patent
Molnar et al.

(10) Patent No.: US 12,469,820 B2
(45) Date of Patent: Nov. 11, 2025

(54) FINE-GRAINED DISAGGREGATED SERVER ARCHITECTURE

(71) Applicant: Intel Corporation, Santa Clara, CA (US)

(72) Inventors: Carleton L. Molnar, Northborough, MA (US); Adel A. Elsherbini, Tempe, AZ (US); Tanay Karnik, Portland, OR (US); Shawna M. Liff, Scottsdale, AZ (US); Robert J. Munoz, Round Rock, TX (US); Julien Sebot, Portland, OR (US); Johanna M. Swan, Scottsdale, AZ (US); Nevine Nassif, Arlington, MA (US); Gerald S. Pasdast, San Jose, CA (US); Krishna Bharath, Phoenix, AZ (US); Neelam Chandwani, Portland, OR (US); Dmitri E. Nikonov, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 791 days.

(21) Appl. No.: 17/548,304

(22) Filed: Dec. 10, 2021

(65) Prior Publication Data

US 2023/0187407 A1 Jun. 15, 2023

(51) Int. Cl.
*H01L 25/065* (2023.01)
*H01L 23/00* (2006.01)
*H01L 23/48* (2006.01)

(52) U.S. Cl.
CPC ........ *H01L 25/0652* (2013.01); *H01L 23/481* (2013.01); *H01L 24/08* (2013.01); *H01L 24/20* (2013.01); *H01L 2224/08147* (2013.01); *H01L 2224/2101* (2013.01); *H01L 2924/1427* (2013.01); *H01L 2924/37001* (2013.01)

(58) Field of Classification Search
CPC ....... H01L 25/0652; H01L 2225/06562; H01L 2225/06503; H01L 2225/06555
See application file for complete search history.

(56) References Cited

U.S. PATENT DOCUMENTS

2010/0072528 A1* 3/2010 Inokuchi ............. G11C 11/1693
257/295
2013/0187292 A1* 7/2013 Semmelmeyer ......... H05K 1/11
257/E23.141

(Continued)

OTHER PUBLICATIONS

Patel, Sanjay, "Accelerator Architectures," IEEE Computer Society, Jul.-Aug. 2008; 9 pages.

(Continued)

*Primary Examiner* — Eliseo Ramos Feliciano
*Assistant Examiner* — Adam Joseph Mott
(74) *Attorney, Agent, or Firm* — Akona IP PC

(57) ABSTRACT

A microelectronic assembly is provided comprising: a first plurality of integrated circuit (IC) dies in a first layer; a second plurality of IC dies in a second layer between the first layer and a third layer; and a third plurality of IC dies in the third layer. In some embodiments, the second plurality of IC dies comprises IC dies in an array of rows and columns, each IC die of the second plurality of IC dies is coupled to more than one IC die of the first plurality of IC dies, and the third plurality of IC dies is to provide electrical coupling between adjacent ones of the second plurality of IC dies.

20 Claims, 15 Drawing Sheets

(56) References Cited

U.S. PATENT DOCUMENTS

| | | |
|---|---|---|
| 2014/0071566 A1* | 3/2014 | Parthasarathy ..... H01L 25/0655 |
| | | 257/659 |
| 2015/0216030 A1 | 7/2015 | Semmelmeyer et al. |
| 2018/0102251 A1* | 4/2018 | Delacruz ................ G06N 20/00 |
| 2019/0041923 A1* | 2/2019 | Atsatt ............. H03K 19/00369 |
| 2019/0221556 A1* | 7/2019 | Gomes ................... H01L 24/09 |
| 2019/0227963 A1* | 7/2019 | Ooi ........................ H01L 25/18 |
| 2019/0312019 A1* | 10/2019 | Pietambaram ........ H01L 23/293 |
| 2019/0385977 A1* | 12/2019 | Elsherbini ........... H01L 23/5389 |
| 2020/0219815 A1* | 7/2020 | Elsherbini .......... H01L 25/0655 |
| 2021/0104492 A1 | 4/2021 | Wu |
| 2021/0111156 A1 | 4/2021 | Elsherbini et al. |
| 2021/0125967 A1* | 4/2021 | Zhai .................... H01L 25/0657 |
| 2021/0202380 A1* | 7/2021 | Sir .......................... H01L 24/17 |
| 2021/0257339 A1 | 8/2021 | Yu et al. |
| 2023/0197711 A1* | 6/2023 | Goto .................. H01L 25/0652 |
| | | 257/314 |

OTHER PUBLICATIONS

Bernstein, Kerry, et al., "Device and Architecture Outlook for Beyond CMOS Switches," Proceedings of the IEEE, vol. 98, No. 12, Dec. 2010; 16 pages.

\* cited by examiner

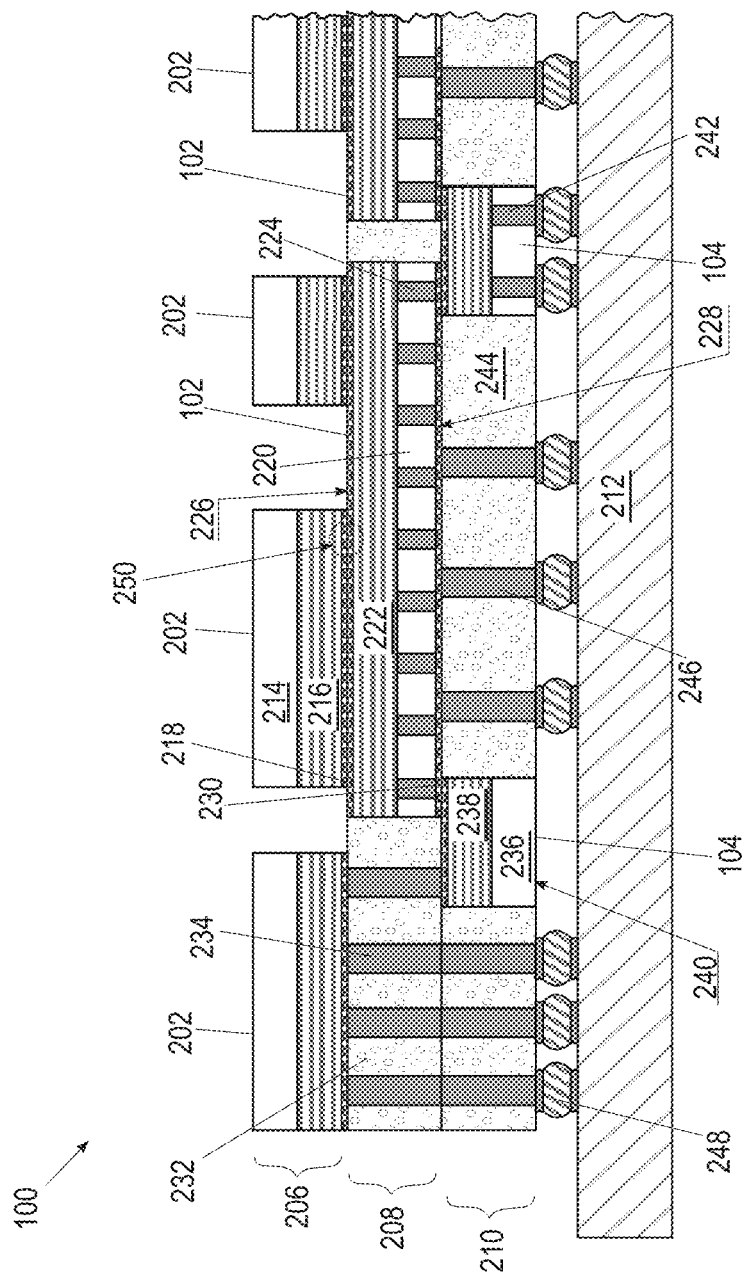
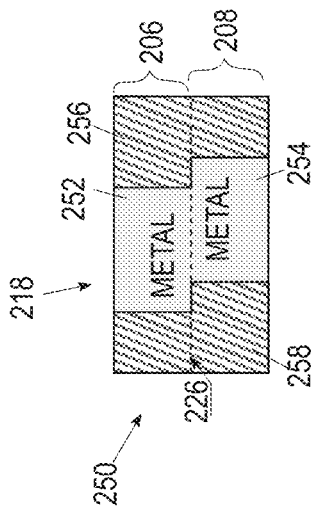
FIG. 2B
FIG. 2C

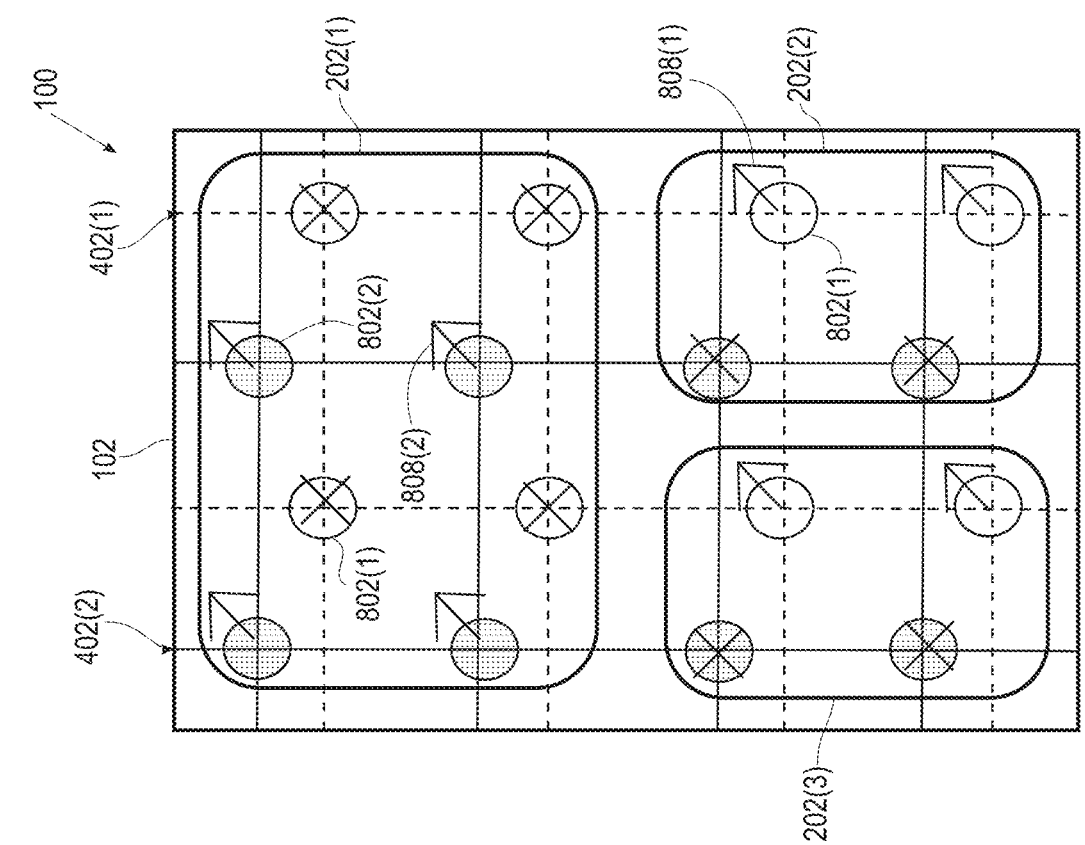
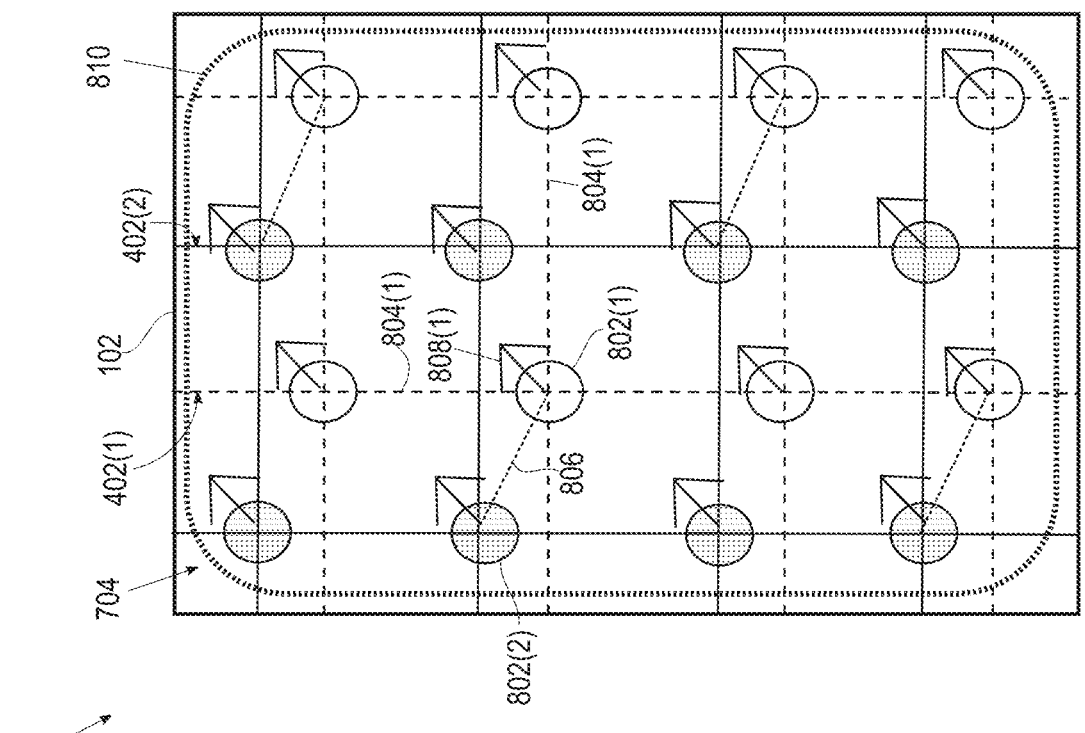
FIG. 8A
FIG. 8B

FINE-GRAINED DISAGGREGATED SERVER ARCHITECTURE

TECHNICAL FIELD

The present disclosure relates to techniques, methods, and apparatus directed to fine-grained disaggregated server architecture in semiconductor integrated circuit (IC) packaging.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2B is a simplified cross-sectional view of a portion of the example microelectronic assembly of FIG. 2A.

FIG. 2C is a simplified cross-sectional view of a detail of the example microelectronic assembly of FIG. 2B.

FIGS. 8A-8B are block diagrams of portions of network on chip configurations in a microelectronic assembly, according to various embodiments of the present disclosure.

DETAILED DESCRIPTION

Overview

Figure 1:
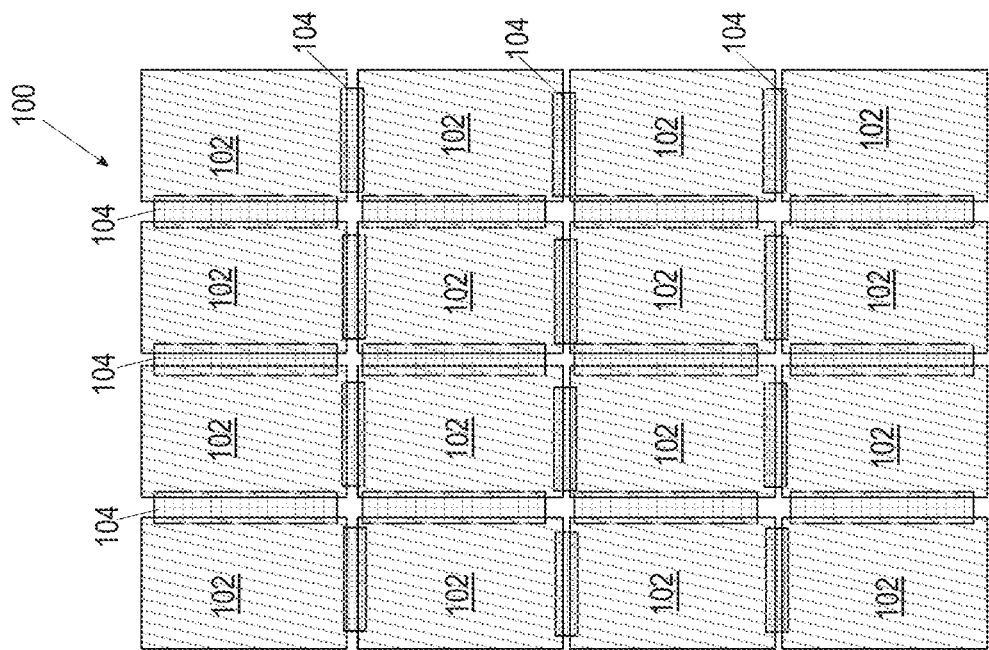
FIG. 1 is a simplified top view of a portion of an example microelectronic assembly, according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller IC dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SOC). In other words, the individual dies are connected together to create the functionalities of a monolithic IC. By using separate dies, each individual die can be designed and manufactured optimally for a particular functionality. For example, a processor circuitry that contains logic circuits might aim for performance, and thus might require a very speed-optimized layout. This has different manufacturing requirements compared to a Universal Serial Bus (USB) controller, which is built to meet certain USB standards, rather than for processing speed. Thus, by having different parts of the overall design separated into different dies, each one optimized in terms of design and manufacturing, the overall yield and cost of the combined die solution may be improved.

The connectivity between these dies is achievable by many different ways. For example, in 2.5D packaging solutions, a silicon interposer and through-substrate vias (TSVs), also called through-silicon vias where the substrate is silicon, connect dies at silicon-interconnect speed in a minimal footprint. In another example, called Embedded Multi-Die Interconnect Bridge (EMIB), a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The EMIB and the 3D stacked architecture may also be combined using an omnidirectional interconnect (ODI), which allows for top-packaged chips to communicate with other chips horizontally using EMIB and vertically, using through-mold vias (TMVs) which are typically larger than TSVs. However, these current interconnect technologies use solder or its equivalent for connectivity, with consequent low vertical and horizontal interconnect density.

One way to mitigate low vertical interconnect density is to use an interposer, which improves vertical interconnect density but suffers from low lateral interconnect density if the base wafer of the interposer is passive. In a general sense, an "interposer" is commonly used to refer to a base piece of silicon that interconnects two dies. By including active circuitry in the interposer, lateral speeds may be improved, but it requires more expensive manufacturing processes, in particular when a large base die is used to interconnect smaller dies. Additionally, not all interfaces require fine pitch connections which may lead to additional manufacturing and processing overheads without the benefits of the fine pitch. Thus, typical modular server architectures for complex and customized server configurations continue to use large monolithic dies to avoid disaggregation overheads.

In this regard, a quasi-monolithic hierarchical integration architecture using recursively coupled plurality of dies to form microelectronic assemblies helps to mitigate several drawbacks mentioned above. The plurality of dies may comprise active dies and/or passive dies, and at least a portion in the plurality of dies are coupled using high-density interconnects. As used herein, "high-density interconnects" comprise die-to-die (DTD) interconnects with sub-10 micrometer pitch, also referred to as "hybrid bonds," "hybrid interconnects," or "direct bond interconnects." In other words, the center-to-center separation between adjacent high-density interconnects is less than or equal to 10 micrometers.

Some embodiments of the present disclosure provide a microelectronic assembly, comprising: a first plurality of IC dies in a first layer; a second plurality of IC dies in a second layer between the first layer and a third layer; and a third plurality of IC dies in the third layer. The second plurality of IC dies comprises IC dies in an array of rows and columns, each IC die of the second plurality of IC dies is coupled to more than one IC die of the first plurality of IC dies, and the third plurality of IC dies is to provide electrical coupling between adjacent ones of the second plurality of IC dies.

The first plurality of IC dies comprises intellectual property (IP) cores in many embodiments. As used herein, the terms "IP core," "IP block," "core complex," or "core" are used interchangeably to refer to a circuit comprising a reusable unit of logic, cell, or IC layout design with a particular functionality and defined interface and serves as a building block in an IC chip design. For example, IP cores in general may comprise a set of memory registers, arithmetic logic unit (ALU), power converters, high-speed input/output (I/O) interfaces, peripherals, programmable microprocessors, micro-controllers, digital signal processors, analog-digital mixed-signal processing blocks, configurable computing architectures, etc. As computing cores typically require additional components to create a fully functional chip or SOC, these complementary components are assumed to be inherent, either coupled directly to the IP cores in question or by way of other IP cores or circuit blocks (e.g., portions, i.e., "blocks" of circuits), in the microelectronic assembly of the various embodiments disclosed herein.

Some embodiments of the present disclosure also provide an IC package comprising: a first IC die in a first layer of the IC package; a second IC die, and a third IC die in a second layer of the IC package; a fourth IC die in a third layer of the IC package; and a package substrate coupled to the third layer of the IC package. The second layer is between the first layer and the third layer, the first IC die is attached to the second IC die, the third IC die is adjacent to the second IC die, and the fourth IC die comprises a conductive pathway between the second IC die and the third IC die.

Some embodiments of the present disclosure also provide an arrangement of IC dies (e.g., a server architecture), comprising: a first plurality of IC dies comprising IC dies having IP cores; a second plurality of IC dies comprising IC dies, each of the IC dies of the second plurality of IC dies having at least one circuit conductively coupled to one or more of the IP cores; and a third plurality of IC dies comprising IC dies, each of the IC dies of the third plurality of IC dies comprising at least one conductive pathway between the second plurality of IC dies with interconnects having a pitch of less than 10 micrometers or "microns". The first plurality of IC dies is in a first layer, the second plurality of IC dies is in a second layer, the third plurality of IC dies is in a third layer, and the second layer is between the first layer and the third layer.

The interconnects between adjacent layers may be distributed with silicon-level interconnect density. As used herein, the term "silicon-level" interconnect density when used with regard to interconnects, comprises interconnect density greater than 10,000 connections per square millimeter. The term refers to trace pitch and/or via density that is generally found within an IC die (e.g., in metallization stacks of the IC die above the active region) as opposed to interconnect density between IC dies of older packaging technologies (e.g., solder-based C4 or larger interconnects). Interconnects with silicon-level interconnect density may have pitch ranging between 0.5 micrometer and 10 micrometer (i.e., in one embodiment, the interconnects may have a pitch of 0.5 micrometer; in another embodiment, the interconnects may have a pitch of 2 micrometers; in some embodiments, the interconnects may have a pitch of less than 10 micrometers; in some embodiments, the interconnects may have a pitch of less than 9 micrometers; in some embodiments, the interconnects may have a pitch of less than 8 micrometers; in some embodiments, the interconnects may have a pitch ranging between 2 micrometers and 10 micrometers; in some embodiments, the interconnects may have a pitch ranging between 4 micrometers and 8 micrometers; etc.). Any possible range of values between 2 micrometers and 10 micrometers may be encompassed in the pitch of the interconnects within the broad scope of the embodiments described herein.

Some embodiments of the present disclosure also provide a microelectronic assembly comprising: a first plurality of IC dies in a first layer; a second plurality of IC dies in a second layer; and a third plurality of IC dies in a third layer. The second layer is between the first layer and the third layer, a first portion of the first plurality of IC dies comprises general-purpose processor circuitry, a second portion of the first plurality of IC dies comprises accelerator circuitry, the first portion is physically mutually exclusive of the second portion, the second plurality of IC dies comprises IC dies that include circuitry conductively coupled to the general-purpose processor circuitry and the accelerator circuitry, and the third plurality of IC dies comprises conductive pathways to provide electrical coupling between adjacent ones of the second plurality of IC dies.

Some embodiments of the present disclosure also provide an IC package comprising: a first IC die comprising a general-purpose processor circuitry; a second IC die comprising an accelerator circuitry; a third IC die comprising circuitry conductively coupled to the general-purpose processor circuitry; a fourth IC die comprising circuitry conductively coupled to the accelerator circuitry; and a fifth IC die comprising conductive pathways between the third IC die and the fourth IC die. The first IC die and the second IC die are in a first layer, the third IC die and the fourth IC die are in a second layer, the fifth IC die is in a third layer, the second layer is between the first layer and the third layer, the first IC die is electrically and mechanically coupled to the third IC die, and the second IC die is electrically and mechanically coupled to the fourth IC die.

Some embodiments of the present disclosure also provide an arrangement of IC dies (e.g., server architecture), comprising: general-purpose processor circuitry in a first plurality of IC dies; accelerator circuitry in a second plurality of IC dies; support circuitry in a third plurality of IC dies conductively coupled to the general-purpose processor circuitry and the accelerator circuitry; and router circuits of a network on chip (NOC) for routing signals between the general-purpose processor circuitry and/or the accelerator circuitry, the router circuits conductively coupled to the general-purpose processor circuitry and the accelerator circuitry. In some embodiments, the conductive pathways between the router circuits, the general-purpose processor circuitry and/or the accelerator circuits, and the router circuits can, and will for the sake of clarity, be referred to as a NOC in the remainder of the specification. The router circuits are in the IC dies of the third plurality, the accelerator circuitry are dispersed among the general-purpose processor circuitry, and conductive pathways of the NOC between the general-purpose processor circuitry may not pass through the accelerator circuitry in some embodiments. In some other embodiments, conductive pathways between the general-purpose processor circuitry may pass through the accelerator circuitry.

Some embodiments of the present disclosure also provide a microelectronic assembly, comprising: a first plurality of IC dies in a first layer; a second plurality of IC dies in a second layer; a third plurality of IC dies in a third layer; and a NOC spanning the microelectronic assembly, the NOC comprising a plurality of conductively coupled router circuits. The second layer is between the first layer and the third layer, the first plurality of IC dies comprises IP cores conductively coupled through the router circuits, the router circuits are of the second plurality of IC dies, and the third plurality of IC dies comprises conductive pathways between adjacent ones of the second plurality of IC dies.

Some embodiments of the present disclosure also provide an IC package, comprising: a first IC die, a second IC die, and a third IC die in a first layer; a first IP core in the first IC die, a second IP core in the second IC die, and a third IP core in the third IC die; a fourth IC die and a fifth IC die in a second layer; a sixth IC die in a third layer; a package substrate coupled to the third layer; and a NOC coupling the first IP core, the second IP core, the third IP core, and the fourth IP core. The second layer is between the first layer and the third layer, the NOC comprises a plurality of conductively coupled router circuits, the first IC die and the second IC die are attached to the fourth IC die, the third IC die is attached to the fifth IC die, and the sixth IC die comprises conductive pathways between the fourth IC die and the fifth IC die.

Some embodiments of the present disclosure also provide an arrangement of IC dies (e.g., server architecture), comprising: IP cores in a first plurality of IC dies in a first layer; and router circuits in a second plurality of IC dies in a second layer. The second layer is not coplanar with the first layer, and each IP core is conductively coupled over a NOC to one of the router circuits by one or more conductors.

Some embodiments of the present disclosure also provide a microelectronic assembly, comprising: a plurality of IC dies in a first layer and a second layer. The first layer and the second layer are not coplanar, the first layer and the second layer are coupled electrically and mechanically with interconnects having a pitch of less than 10 micrometers between adjacent ones of the interconnects, a first IC die in the plurality of IC dies is fabricated using a complementary metal-oxide semiconductor (CMOS) process and does not comprise transistors having a ferromagnetic material, and a second IC die in the plurality of IC dies is fabricated using processes and materials that are typically not used in CMOS fabrication (i.e., beyond-CMOS processes), and comprises transistors having a ferromagnetic material.

Some embodiments of the present disclosure also provide an IC package, comprising: a first IC die in a first layer; a second IC die in a second layer; a third IC die in a third layer; and a package substrate coupled to the third layer. The second layer is between the first layer and the third layer, interconnects between the first layer and the second layer comprise interconnects having a pitch of less than 10 micrometers between adjacent ones of the interconnects, one of the first IC die and the second IC die comprises transistors having a ferromagnetic material, and the other of the first IC die and the second IC die comprises a first circuit for voltage conversion, a second circuit for frequency shifting and a third circuit for voltage regulation.

Some embodiments of the present disclosure also provide an arrangement of IC dies (e.g., server architecture), comprising: a plurality of IP cores distributed across at least a first layer and a second layer; router circuits conductively coupled to the plurality of IP cores; and circuitry distributed in an array of IC dies and conductively coupled to the plurality of IP cores and the router circuits. The first layer and the second layer are not coplanar, at least one IP core in the plurality of IP cores is fabricated using a beyond-CMOS process and comprises transistors having a ferromagnetic material, and the router circuits are distributed in the array of IC dies.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a semiconductor or analogous material such as a semiconductor die.

In some embodiments, the IC dies disclosed herein may comprise substantially monocrystalline semiconductors, such as silicon or germanium, as a base material on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., metal-oxide semiconductor (MOS) FETs (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes build up layers (e.g., ABF layers).

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, DTD interconnects and die-to-package substrate (DTPS) interconnects. DTD interconnects may also be referred to as First Level Interconnects (FLI). DTPS interconnects may also be referred to as Second Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
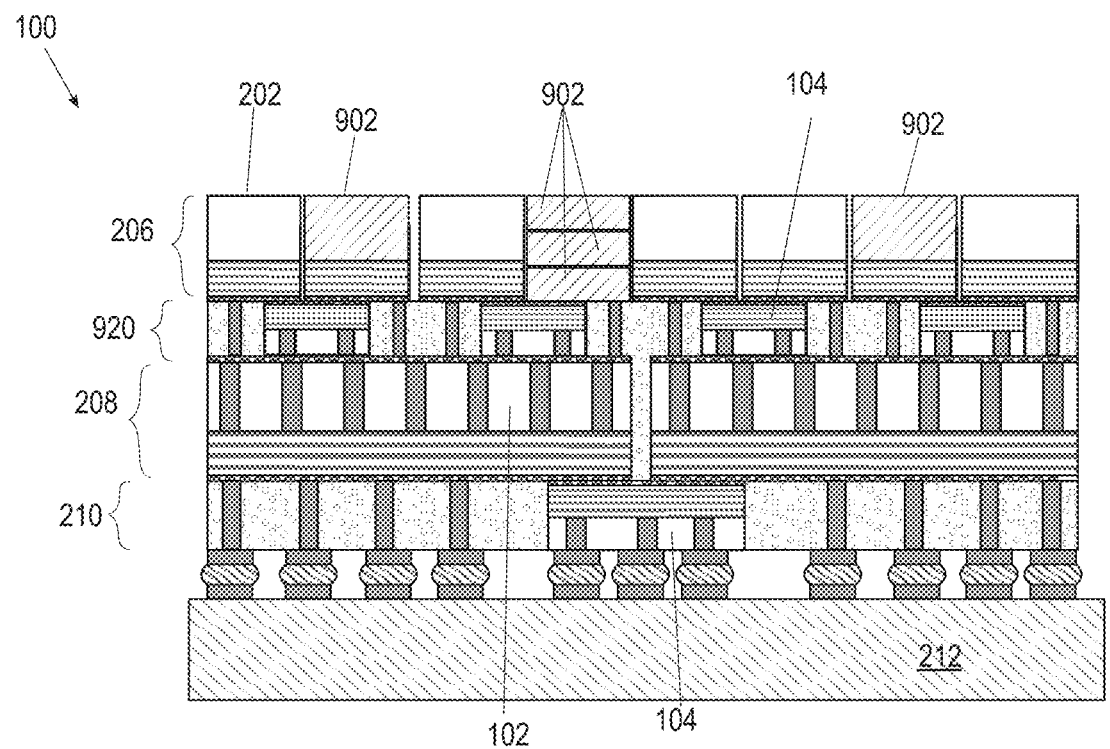
FIG. 10 is a simplified cross-sectional view of an example microelectronic assembly comprising IC dies made of more than one different process, according to embodiments of the present disclosure.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

Various operations may be described as multiple discrete actions or operations in turn in a manner that is most helpful in understanding the example subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1 is a schematic top view of a portion of a microelectronic assembly 100 according to some embodiments of the present disclosure. Microelectronic assembly 100 comprises a plurality of base dies 102 (singly "base die 102," collectively "base dies 102") electrically coupled through one or more bridge dies 104 (singly "bridge die 104," collectively "bridge dies 104"). In various embodiments, bridge die 104 comprises a relatively small piece of silicon (e.g., smaller than base die 102) embedded or otherwise placed under edges of two adjacent base dies 102. In some embodiments, bridge dies 104 may be under base dies 102; in some other embodiments, bridge dies 104 may be over base dies 102; in yet other embodiments, some bridge dies 104 may be under some base dies 102 and other bridge dies 104 may be over other base dies 102. In a general sense, two or more base dies 102 may be coplanar, located in the same layer (e.g., tier, story, row, section, level, etc.) of a three-dimensional (3D) multi-layer package comprising dies in a plurality of layers.

The plurality of base dies 102 may comprise circuits that function collectively as a high-bandwidth SOC level coherent fabric (e.g., interconnected circuits, network) that facilitates data and control transmission across linked components. Such silicon-interconnect fabric, allowing bare IC dies to be connected directly to wiring on modular IC dies in the plurality of base dies 102, facilitates high-density wiring between the connected IC dies with as small interconnect pitches as wiring within a single IC die. Many more die-to-die connections are thus possible, and those connections are able to transmit data faster while using less energy. In various embodiments, base die 102 may comprise an IC die with circuits for low-power functionalities and subsystems for always-on and ultra-low-power standby functionalities. Base die 102 may include interfaces for peripheral component interconnect express (PCIe), USB (e.g., USB 3 Type C), audio, debug, secure digital input output (SDIO), and various other low-power I/O components. In various embodiments, base die 102 comprises support circuitry for other IC dies in microelectronic assembly 100.

In various embodiments, the plurality of base dies 102 may be arranged in a tiled architecture as an array of rows and columns, with base dies 102 substantially identical in shape (but not necessarily in function) to each other. In some embodiments, base dies 102 may be substantially identical with each other in terms of circuits and structures, and thus replicated in functionality as well. In other embodiments, one or more base die 102 may comprise circuits and structures different from some other base dies 102. In the array configuration, because the SOC fabric is not one monolithic die extending across the entire footprint of microelectronic assembly 100, but rather comprised of multiple base dies 102, a single base die 102 and the collection of base dies 102 may be less expensive to manufacture, test, and assemble than a single monolithic die having the same combined footprint. Due to the lower cost associated with manufacturing smaller sized IC dies, base die 102 may also be provisioned with active circuit blocks that are not necessarily provisioned in traditional silicon interposers. Thus, in various embodiments, base die 102 may comprise active interposers, although some base dies 102 may also comprise passive interposers, without any active circuitry.

In some embodiments, base die 102 may be fabricated using manufacturing processes tailored for low-power applications, such as 22 nanometer FinFET Low-Power (22FFL), 14 nanometer process, or any other suitable semiconductor manufacturing process for the types of circuits and functionalities comprised in base die 102. In some embodiments, separate individual base die 102 can be fabricated using a corresponding desired process to optimize performance (e.g., for functionalities such as I/O, Full Integrated Voltage Regulator (FIVR), passives, etc.) or cost, or both. For example, the small size of base die 102 may allow manufacturing using latest process nodes for maximum performance, in terms of power, frequency, leakage, cache capacity, etc. for at least some base dies 102. Thus, certain base dies 102 used for cache may be manufactured using a process optimized for cache capacity, while certain other base dies 102 used for high-speed routing may be manufactured using another process suitable for high speeds, and so on. While the array of base dies 102 may occupy a relatively large footprint (e.g., 92 square millimeter), an individual base die 102 may be much smaller (e.g., 10 square millimeter) permitting higher manufacturing yield, resulting in lower manufacturing cost than for a monolithic large die.

Figure 2A:
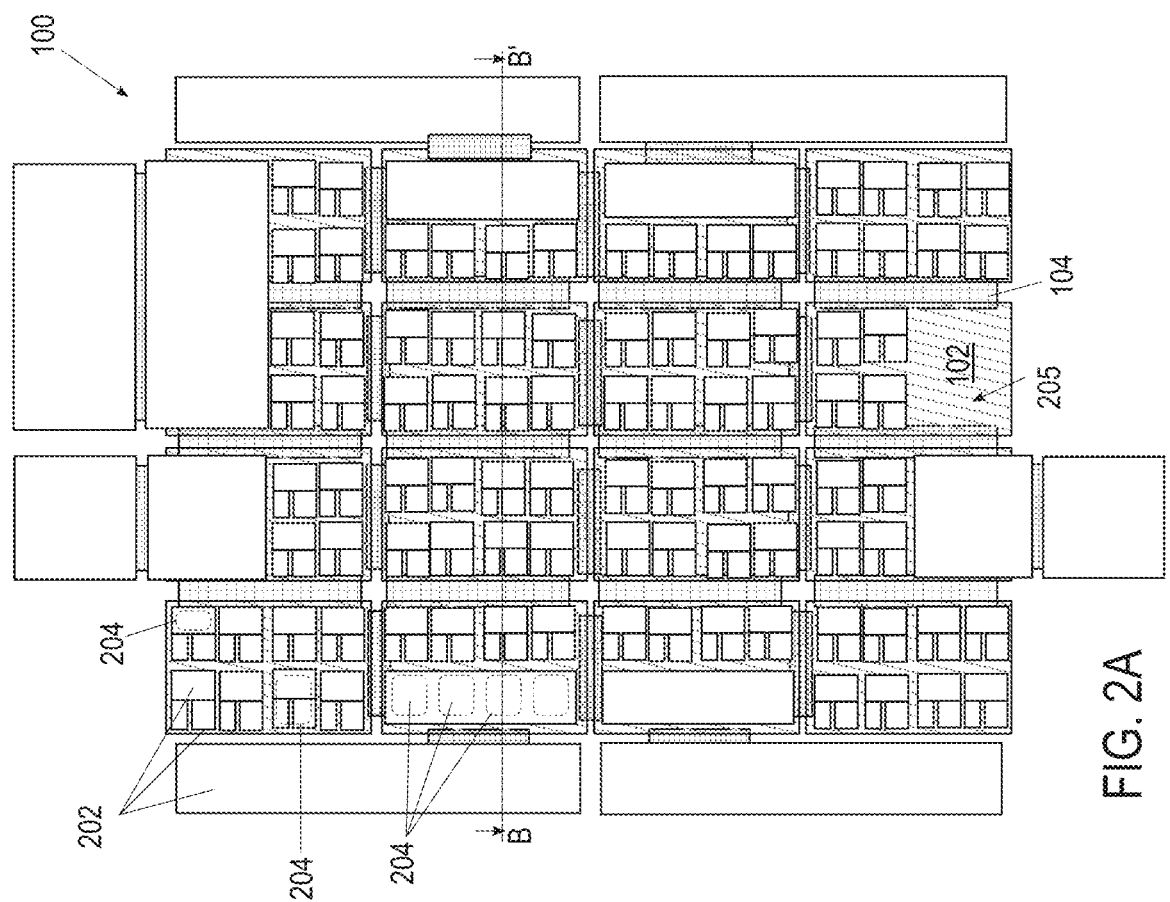
FIG. 2A is a simplified top view of a portion of an example microelectronic assembly, according to some embodiments of the present disclosure.

As shown in FIG. 2A, one or more IP dies 202 (singly "IP die 202," collectively "IP dies 202") comprising reusable IP cores 204 (singly "IP core 204," collectively "IP cores 204") may be coupled in another layer over the plurality of base dies 102. Although only a few IP cores 204 are shown in the figure, it may be understood that all IP dies 202 comprise part, one or more such IP cores 204. IP cores 204 and IP dies 202 may be related in a one-to-one, many-to-one, and/or one-to-many configurations in various embodiments. For example, one IP die 202 may comprise one IP core 204; one IP core 204 may be distributed across multiple IP dies 202; and one IP die 202 may comprise more than one IP core 204. The plurality of IP dies 202 may together form one or more core complexes.

In various embodiments, microelectronic assembly 100 may embody a server architecture. In such cases where microelectronic assembly 100 is used in a microprocessor, an example IP core 204 may comprise the smallest physical hardware unit (e.g., electronic circuit) capable of performing a processing task; such IP core 204 may comprise an ALU and one or two sets of supporting memory registers. A logical hardware unit capable of processing a single thread of execution may comprise a central processor unit (CPU) as one or more IP cores 204; a single core processor that does not support hyperthreading is the equivalent of a single CPU; a hyperthreading processor with a single core is the functional equivalent of two CPUs; and so on. CPUs comprised in one or more IP cores 204 may be dedicated (e.g., graphics processing unit (GPU), accelerators) or generic (e.g., general-purpose processor).

In various embodiments, the collection of base dies 102 may provide a resource pool shared by some or all IP cores 204 in IP dies 202. Beneficially, as new IP core technology is introduced, IP cores 204 may be substituted in the manufacturing process without requiring redesign of base dies 102, reducing manufacturing costs and improving manufacturing flexibility and market responsiveness. Base dies 102 may provide multiple generic or customizable interfaces to IP dies 202, which can be coupled to the array of base dies 102 in a 3D architecture to optimize performance (e.g., bandwidth latency) between various components. Although IP dies 202 and base dies 102 appear in a many-to-one relationship in the figures, other relationships may be used within the broad scope of the embodiments of the present disclosure. For example, a single base die 102 may attach to a single IP die 202; or several base dies 102 may attach to a single IP die 202, etc. The high bandwidth, low latency SOC level fabric facilitated by the array of base dies 102 in microelectronic assembly 100 does not compete for die area with IP cores 204 provisioned in IP dies 202. In such embodiments, base dies 102 may include circuits ("support circuits" or "support circuitry") to support the collective operation of IP cores 204 provisioned in IP dies 202. For example, base die 102 may include data storage circuits, controller circuits, clock circuits, voltage regulation circuits, and/or I/O circuits conductively coupled by a NOC configuration, to the plurality of IP cores 204 disposed in IP dies 202. In various embodiments, the support circuits in base die 102 may provide power, data, control commands and the like to IP die 202. Such an arrangement beneficially and advantageously permits selection of one or more IP cores 204 that address a particular need or functionality while still retaining a "standard" or "generic" die configuration for base dies 102. In addition, as new IP core technology is introduced, IP dies 202 may be substituted in the manufacturing process without requiring a redesign of base die 102, thereby reducing manufacturing costs and improving manufacturing flexibility and market responsiveness. In various embodiments, any one base die 102 may be relatively larger than each of IP dies 202 attached directly thereto.

Traditionally, circuits comprised in IP cores are designed to be used with circuits in other IP cores to build complex ICs such as SOCs, Application Specific Integrated Circuits (ASICs), Application Specific Standard Products (ASSPs), and Field Programmable Gate Arrays (FPGAs) on a single monolithic chip. Such complex ICs, in turn, are used in products such as computers, mobile phones, television desktop boxes, digital cameras, digital audio players, automobile engine and industrial process controllers, toys, smart cards, hearing aids, heart monitors, and other devices that use or process data. In embodiments of the present disclosure, IP cores 204 are comprised in a "chiplet" that is IP die 202. In other words, a circuit represented by IP core 204 may be realized in a hardware form as IP die 202. Thus, the chiplet comprises a modular IC die that can be coupled to other modular IC dies, similar to a virtual IP core in a monolithic SOC.

For example, a conventional SOC may be a monolithic IC die incorporating a CPU and an additional hundred IP cores on the same IC die. The design is then scaled by moving to the next processing node, which is an expensive process. With the chiplet or tile model, the hundred IP cores are hardened into smaller chiplets, which can be mixed-and-matched, and then assembled in a package to build the SOC. Chiplets can have different functionalities and may also be made at different process nodes and re-used in different designs. The combination of IP cores or chiplets (used interchangeably herein to refer to a circuit or its hardware implementation in an IC die form, respectively) in IP dies 202 of microelectronic assembly 100 may together comprise functionalities of a conventional compute die in some embodiments, including compute cores, graphics, and display engines for monitors, comprising for example, quad-channel (16-bit) Low-Power Double Data Rate (LPDDR) memory, CPU cores, clocks, system agent, GPU, display engine, infrastructure processing unit (IPU), high-speed I/O interfaces, etc.

In various embodiments, the array of generic base dies 102 may share a common distributed cache for appropriate IP dies 202. Any one IP die 202 may be located on the array of base dies 102 in a location best suited to its respective function (e.g., package pin locations) or affinity to other IP cores 204 comprised in other IP dies 202 (e.g., based on functionalities of the other IP cores 204). In other words, in some embodiments, a particular one of base dies 102 may be chosen for attachment of a particular one of IP dies 202 based on a functionality of the particular one of IP dies 202; in other embodiments, a particular one of base dies 102 may be chosen for attachment of a particular one of IP dies 202 based on a relative location of the particular base die 102 in the array; in yet other embodiments, a particular one of base dies 102 may be chosen for attachment of a particular one of IP dies 202 based on an affinity (e.g., based on functionality) of IP core 204 in the particular one of IP dies 202 to other IP cores in other IP dies 202.

For example, IP die 202 may comprise IP core 204 having processor circuitry; one of base dies 102 may comprise a second circuit (e.g., memory controller) whereas another one of base dies 102 may comprise a third circuit (e.g., I2C interface circuit). IP core 204 may have a greater number of electrical connections with the second circuit than with the third circuit. Hence, IP die 202 may be coupled directly to base die 102 having the second circuit with DTD interconnects having a pitch of less than 10 micrometers in an example embodiment.

In another example, IP die 202 may comprise IP core 204 having an IO interface circuit; one of base dies 102 may be located close to a periphery of microelectronic assembly 100, or to an external interface of microelectronic assembly 100, whereas another one of base dies 102 may be located towards a middle of microelectronic assembly 100. In an example embodiment, based on the circuit of IP core 204, IP die 202 may be coupled to base die 102 that is closer to the periphery with DTD interconnects having a pitch of less than 10 micrometers such that an electrical pathway from IP core 204 to the external interface or the periphery is shorter than from base die 102 in the middle of microelectronic assembly 100.

In yet another example, one of IP dies 202 may comprise a processor circuitry and other ones of IP dies 202 may comprise memory blocks. The processor circuitry may be configured to operate with the memory blocks. IP dies 202 having memory blocks may be coupled to a particular one of base die 102. In an example embodiment, IP die 202 having the processor circuitry may be coupled to the same IC die 102 so as to be closer to the memory blocks with shorter electrical pathways.

IP die 202 may be attached to base die 102 at one or more network connection points depending on its size and bandwidth requirements. Each IP die 202 may comprise a different IP core 204 in some embodiments. In other embodiments, certain IP dies 202 located over a particular base die 102 may comprise the same IP cores 204, which differ from IP cores 204 in other IP dies 202 located over another base die 102. In yet other embodiments, different IP cores 204 in separate IP dies 202 may be located anywhere over the array of base dies 102.

In current technologies, to reduce cost in building custom products for various different applications, an SOC may be built to serve multiple different applications although certain of the IP cores in the SOC are needed in some applications but not in others. The superfluous IP cores may be disabled and unused in those applications, causing "dark silicon," which refers to areas of the SOC that are unusable. Essentially, dark silicon refers to the amount of circuitry of an IC that cannot be powered-on at the nominal operating voltage. Dark silicon is costly from a silicon area perspective, both in terms of actual money spent and opportunity cost for that area. With a built-to-workload approach enabled by embodiments of the present disclosure, IP cores that are not required in one application based on customer needs need not be assembled over base dies 102, as shown by an empty space 205 in the figure, thereby reducing and/or eliminating dark silicon. Empty space 205 may be scavenged for other IP cores 204, or the remaining and necessary IP cores 204 rearranged to decrease the overall footprint of microelectronic assembly 100.

For example, a first IP die 202(1) may have a first IP core 204(1) with a first functionality. A second IP die 202(2) may have a second IP core 204(2) with a second functionality. A first microprocessor having the first functionality and the second functionality will include both IP dies 202(1) and 202(2); on the other hand, a second microprocessor having the first functionality but not the second functionality may include IP die 202(1), but not IP die 202(2), thus allowing for fine-grained selection of functionalities without any significant loss in usable silicon area. Further, both the first and second microprocessors may use the same array of base dies 102 (i.e., base dies 102 may be identical between the first and second microprocessors) and bridge dies 104 (i.e., bridge dies 104 may be identical between the first and second microprocessors). In other words, the size, number and circuits of base dies 102 and bridge dies 104 may be identical between the first and second microprocessors.

Some embodiments of microelectronic assembly 100 may enable fine-grained disaggregation, allowing individual IP cores 204 to be removed or replaced as needed based on customer needs and/or manufacturing constraints (among other reasons). Such fine-grained disaggregation also allows process selection on a per-IP core basis to optimize power-performance-area-cost per IP die. For instance, IP die 202 comprising IP core 204 that is a high-powered CPU may need the latest process node for highest density of transistors and lowest power per square area or low voltage-operation, while another IP die 202 comprising another IP core 204 that is a voltage regulator may perform better with a process supporting much higher input-voltage to maximize efficiency. Thus, in some embodiments, some IP dies 202 may be fabricated using advanced process node (e.g., 10 nm process) and may comprise smaller transistors (e.g., transistors having 64 nm transistor gate pitch) than transistors in other IP dies 202 (e.g., transistors having 160 nm transistor gate pitch) fabricated using an older process (e.g., 45 nm process). In some embodiments, certain IP dies 202 (e.g., comprising IP cores 204 with logic and/or memory circuits) may comprise transistors having thinner gate oxide and, therefore, lower breakdown voltage than transistors in other IP dies 202 (e.g., transistors used for higher voltage applications, such as power routing).

This heterogeneous integration allows building a completely new SOC out of chiplets of various generations and of process technologies that are not usually compatible with CMOS. By building a base die complex comprising an array of base dies 102 to route inter-base die traffic between different base dies 102 and inter-chiplet traffic between different IP dies 202 and distribute the bandwidth among connected IP cores 204, individual IP cores 204 of IP die 202 are not burdened with the wire cost and complexity of unrelated logic. This also further disassociates IP dies 202 from any process selection interdependencies with base dies 102.

Any suitable combination, layout, configuration, or arrangement of various IP cores 204 and corresponding IC dies, for example, base die 102, bridge die 104, and IP die 202 may be used in microelectronic assembly 100 within the broad scope of the embodiments of the present disclosure. For example, multiple such microelectronic assemblies may be stacked within a single package. Microelectronic assembly 100 may comprise all the functionalities of a monolithic IC, such as a microprocessor, in some embodiments. In other embodiments, microelectronic assembly 100 may form a portion (e.g., system controller block) of a larger IC, such as a microprocessor, a CPU, a memory device, e.g., a high-bandwidth memory device, a logic circuit, input/output circuitry, a transceiver such as a field programmable gate array transceiver, a gate array logic such as a field programmable gate array logic, of a power delivery circuitry, a Ill-V or a Ill-N device such as a Ill-N or Ill-N amplifier (e.g., GaN amplifier), Peripheral Component Interconnect Express circuitry, Double Data Rate transfer circuitry, or other electronic components known in the art.

A portion of a cross-section of microelectronic assembly 100 along axis BB' is shown in FIG. 2B. Microelectronic assembly 100 is an example of quasi-monolithic packaging architecture. Microelectronic assembly 100 may comprise at least three layers: a first layer 206 including IP dies 202; a second layer 208 including base dies 102; and a third layer 210 including bridge dies 104. The three-layered structure may be mounted on a package substrate 212. In some embodiments, package substrate 212 may comprise a PCB having multiple layers of conductive traces embedded in one or more layers of organic dielectric. For example, package substrate 212 may comprise a laminate substrate with several layers of metal planes or traces that are interconnected to each other by microvias and/or through-hole plated vias, with input/output routing planes on the top and bottom layers, while the inner layers are used as a ground and power plane. In other embodiments, package substrate 212 may comprise an organic interposer; in yet other embodiments, package substrate may comprise an inorganic interposer (e.g., made of glass, ceramic or semiconductor materials). In yet other embodiments, package substrate 212 may comprise a composite of organic and inorganic materials, for example, with an embedded semiconductor die in an organic substrate.

Any IP die 202 may comprise several layers: a semiconductor substrate 214 having active devices (e.g., transistors, diodes, etc.) and a metallization stack 216 comprising layers of dielectric (e.g., interlayer dielectric (ILD)) and metallization routing (e.g., metal layers between ILD layers and vias through the ILD). IP die 202 may be coupled electrically and mechanically to base die 102 with DTD interconnects 218. In various embodiments, DTD interconnects 218 comprise hybrid bonds comprised of metal-to-metal and oxide-to-oxide (e.g., silicon oxide-to-silicon oxide) bonds, permitting silicon-level interconnect density and low pitch interconnection, for example, greater than 10,000 connections per square millimeter, at an interface between layers 206 and 208 (e.g., between base dies 102 and IP dies 202). As used herein, the term "interface" when used in reference to a structural connection between two components refers to a boundary, a joint, or attached surfaces of dissimilar materials of those components.

In an example embodiment, the pitch of DTD interconnects 218 may be approximately 2 micrometers (microns) or smaller. In other embodiments, the pitch may be approximately 2 micrometers or larger. In the example embodiment shown, IP dies 202 are coupled to base dies 102 in a face-to-face (FTF) configuration. In other embodiments, IP dies 202 may be coupled to base dies 102 in a face-to-back (FTB) or back-to-back (BTB) configuration depending on particular needs, with TSVs that provide electrical coupling to the active devices in substrate 214 and metallization stack 216. In some embodiments, some IP dies 202 may be coupled in a FTF configuration with some base dies 102 and other IP dies 202 may be coupled in a BTB configuration with other base dies 102 and yet other IP dies 202 may be coupled in a FTB with base dies 102.

Any base die 102 in second layer 208 may comprise several layers: a semiconductor substrate 220 having active devices (e.g., transistors, diodes, etc.) and a metallization stack 222 comprising layers of dielectric (e.g., ILD) and metallization routing (e.g., metal layers between ILD layers and vias through the ILD). Base die 102 may be coupled electrically and mechanically to IP die 202 with DTD interconnects 218. TSV 224 through substrate 220 of base die 102 may provide electrical coupling between two opposing interfaces 226 (between layers 206 and 208) and interface 228 (between layers 208 and 210). Base die 102 may be coupled to IP die 202 at interface 226 and to bridge die 104 in third layer 210 on another interface 228 opposite to interface 226.

In many embodiments, base die 102 may be coupled electrically and mechanically to bridge die 104 at interface 228 with DTD interconnects 230. In some embodiments, the pitch of DTD interconnects 218 may be smaller than the pitch of DTD interconnects 230; in other embodiments, the pitch of DTD interconnects 218 may be the same as the pitch of DTD interconnects 230. In various embodiments, DTD interconnects 230 comprise hybrid bonds comprised of metal-to-metal and oxide-to-oxide (e.g., silicon oxide-to-silicon oxide) bond, permitting silicon-level interconnect density and low pitch interconnection. In the example embodiment shown, base die 102 is coupled to bridge die 104 in a FTB configuration, with metallization stack 222 of base die 102 distant from metallization stack 238 of bridge die 104. In other embodiments, base die 102 may be coupled to bridge die 104 in a FTF or BTB configuration depending on particular needs. For example, base die 102 may be flipped around so that metallization 222 is proximate to bridge die 104 rather than to IP die 202.

In some embodiments, base die 102 may be embedded in, or surrounded by, a dielectric 232 (e.g., silicon oxide, silicon nitride, mold compound). Through-dielectric vias (TDVs) 234, also referred to as TMVs where the dielectric is a mold compound, may facilitate electrical coupling between two opposing sides of second layer 208, for example, for power delivery and high-speed signaling. In many embodiments, a thickness of second layer 208, including base die 102, may be less than 40 micrometer.

Any bridge die 104 in third layer 210 may comprise an IC die having several layers: a semiconductor substrate 236 and a metallization stack 238 comprising layers of dielectric (e.g., ILD) and metallization routing (e.g., metal layers between ILD layers and vias through the ILD). In some embodiments, bridge die 104 may not comprise any active devices such as transistors, functioning instead merely as a routing intermediary for high-speed, high-density interconnections through metallization stack 238. In some embodiments, bridge die 104 may comprise active devices in semiconductor substrate 236. Bridge die 104 may be coupled electrically and mechanically to base die 102 on interface 228 (between layers 208 and 210) with DTD interconnects 230 whereas a side 240 opposite to interface 228 may be proximate to package substrate 212. In some embodiments, bridge die 104 may comprise TSVs 242 providing electrical coupling between interface 228 and opposing side 240.

In various embodiments, bridge die 104 may be embedded in, or surrounded by, a dielectric 244 (e.g., silicon oxide, silicon nitride, mold compound). Dielectric 244 may comprise the same material as dielectric 232 in some embodiments; in other embodiments, dielectric 244 may comprise a different material. TDVs 246 through dielectric 244 may facilitate electrical coupling between two opposing sides of third layer 210, for example, for power delivery and high-speed signaling.

In various embodiments, layers 208 and 210 carry power to layer 206. Because layer 206 has no further layers thereover, at least one surface of IP die 202 is available for cooling, for example, to attach a heat sink and other such heat transfer aids. Because IP cores 204 in the plurality of IP dies 202 may consume more power than base die 102 or bridge die 104, IP die 202 may be provided dedicated power connectivity through layers 208 and 210. Whereas data signals can move around within layers, power is delivered straight from package substrate 212 through layers 210 and 208 to layer 206. At least some of TDVs 246, 234 and TSVs 242 and 224 facilitate such power connectivity in microelectronic assembly 100. Further, at least some of TDVs 246, 234 and TSVs 242 and 224 facilitate signal (e.g., data) connections also.

Third layer 210 may be coupled to package substrate 212 with DTPS interconnects 248. In the example embodiment shown, DTPS interconnects 248 comprise solder-based interconnections. Although not shown so as not to clutter the drawings, one or more of layers 206, 208 and 210 may comprise redistribution layers (RDL) comprising dielectric (e.g., polyimide, silicon oxide, silicon nitride) with electrical pathways therein to route or reroute between interconnects of a first pitch to interconnects of a different, second pitch. For example, such RDL may facilitate routing at an interface between second layer 208 and third layer 210 (e.g., to route between TDV 234 in second layer 208 and TDV 246 in third layer 210, or between TDV 234 in second layer 208 and bridge die 104 in third layer 210).

In some embodiments, one or more of base die 102, bridge die 104 and IP die 202 may comprise ultra-small semiconductor dies with footprint less than 10 mm$^2$. In some other embodiments, one or more base die 102, bridge die 104 and IP die 202 may comprise semiconductor dies of any size. In yet other embodiments, one or more base die 102, bridge die 104 and IP die 202 may comprise other microelectronic assemblies, such as microelectronic assembly 100, in a recursive (e.g., nested, hierarchical) arrangement. For example, base die 102 may comprise structures and components substantially similar to microelectronic assembly 100. In yet other embodiments, one or more of base die 102, bridge die 104 and IP die 202 may comprise a plurality of semiconductor dies (e.g., IC dies) stacked one on top of another, electrically coupled with high-density interconnects.

Such a quasi-monolithic hierarchical architecture as depicted in FIG. 2B allows dies of disparate manufacturing technologies (e.g., technology node, or process node, or simply node) to be coupled together seamlessly within microelectronic assembly 100. In a general sense, different processes often imply different circuit generations and architectures. Smaller (or more recent) the processing technology, smaller are the feature sizes, and consequently, the resulting transistors are both faster and more power efficient. For example, microelectronic assembly 100 may include IP die 202 manufactured using 10 nm process, base die 102 manufactured using 22 nm process and bridge die 104 manufactured using 45 nm process.

In various embodiments, selection of materials for dielectric 232 and 244 may be appropriately based on recursive re-implementation and hierarchical coupling of microelectronic assembly 100. In some embodiments, any of dielectric 232 and 244 may comprise silicon oxide, silicon nitride or other inorganic dielectric materials compatible with semiconductor manufacturing process. In some other embodiments, any of dielectric 232 and 244 may alternatively comprise organic dielectric materials, such as polyimide materials, glass reinforced epoxy matrix materials, organic materials such as silica-filled epoxy, or a low-k or ultra-low-k dielectric (e.g., carbon-doped dielectrics, fluorine-doped dielectrics, porous dielectrics, organic polymeric dielectrics, photoimageable dielectrics, and/or benzocyclobutene-based polymers).

Interconnects may also be hierarchically described: local within a single die, intermediate between dies in a microelectronic assembly, and global between hierarchical microelectronic assemblies. Such a quasi-monolithic hierarchical integration architecture allows process optimization for each individual circuit block embodied in any of base die 102, bridge die 104 and IP die 202. Where previously such circuit blocks were incorporated into one large monolithic semiconductor die, embodiments of the present disclosure allow individual circuit blocks to be implemented in individual dies using processing technology suitable for the functionality and/or design thereof, enabling much better yield and manufacturing improvements. Some embodiments of the present disclosure facilitate better reuse and configurability of CPUs and other processors and provide higher granularity/customizability in process selection and interconnect routing.

This architecture is particularly useful for multi-core architectures, where composite processing elements may be formed using two levels of dies (e.g., IP die 202 and base die 102) which may then be combined together to form a larger computing structure. The larger computing structure may be further combined to form a larger number of processors and so on. One particular flexibility in the structure may be the ability to vertically stack the different dies to improve functionality. For example, memory dies may be stacked one on top of another to increase capacity. In another example, ALUs implemented in individual dies may be stacked one on top of another for improved throughput if the thermal solution can handle the increased power densities of the stacked ALUs. The microelectronic assemblies as described herein may help to reduce the cost and improve line utilization. The arrangements as disclosed in the various embodiments described herein can also allow interoperability with devices from other manufacturers or other accelerators.

A detail 250 of DTD interconnects 218 comprising hybrid bonds having silicon-level interconnect density is shown in FIG. 2C. At interface 226 between layer 206 and layer 208, conductive contact 252 of layer 206 (e.g., belonging to IP die 202) may bond with conductive contact 254 of layer 208 (e.g., belonging to base die 102); likewise, dielectric 256 (e.g., silicon oxide, silicon nitride, silicon oxynitride, etc.) in layer 206 (e.g., belonging to IP die 202) may bond with dielectric 258 (e.g., silicon oxide, silicon nitride, silicon oxynitride, etc.) in layer 208 (e.g., belonging to base die 102). The bonded interconnects form DTD interconnects 218, comprising hybrid bonds, providing electrical and mechanical coupling between layer 206 and layer 208. Note that the structure as described may be applicable to any similar hybrid bonds, for example, in some embodiments of DTD interconnects 230 at interface 228 between layer 208 and layer 210.

Note that FIGS. 1, and 2A-2C are intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assembly as shown in FIGS. 1, and 2A-2B may include multiple dies and/or XPUs along with other electrical components.

Additionally, although some components of the assemblies are illustrated in FIGS. 1, and 2A-2B as being planar rectangles or formed of rectangular solids, this is simply for ease of illustration, and embodiments of these assemblies may be curved, rounded, or otherwise irregularly shaped as may result due to the manufacturing processes used to fabricate various components.

Figure 3B:
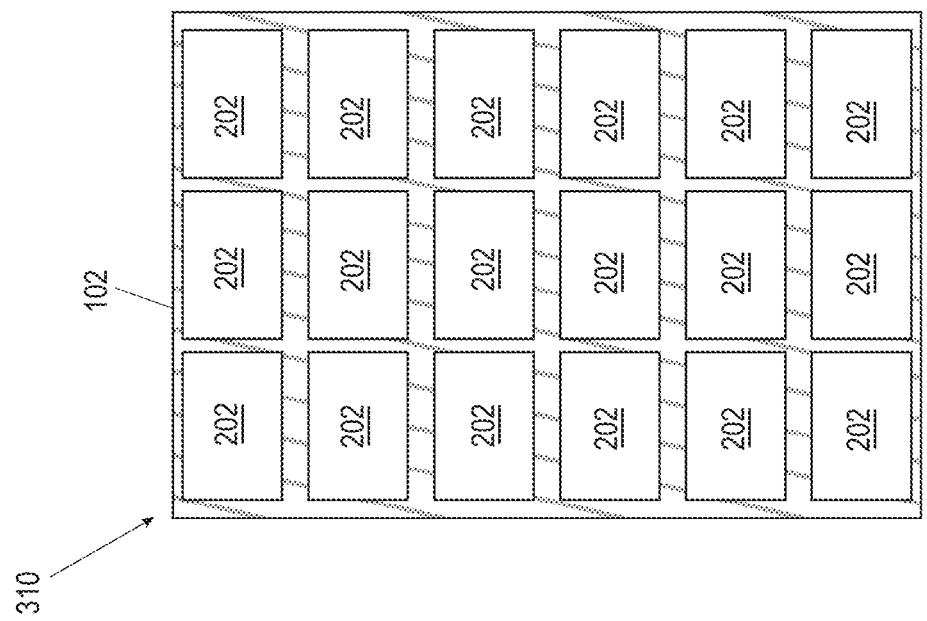
FIGS. 3A and 3B are simplified top views of example IC die configurations in a portion of a microelectronic assembly, according to some embodiments of the present disclosure.
Figure 3A:
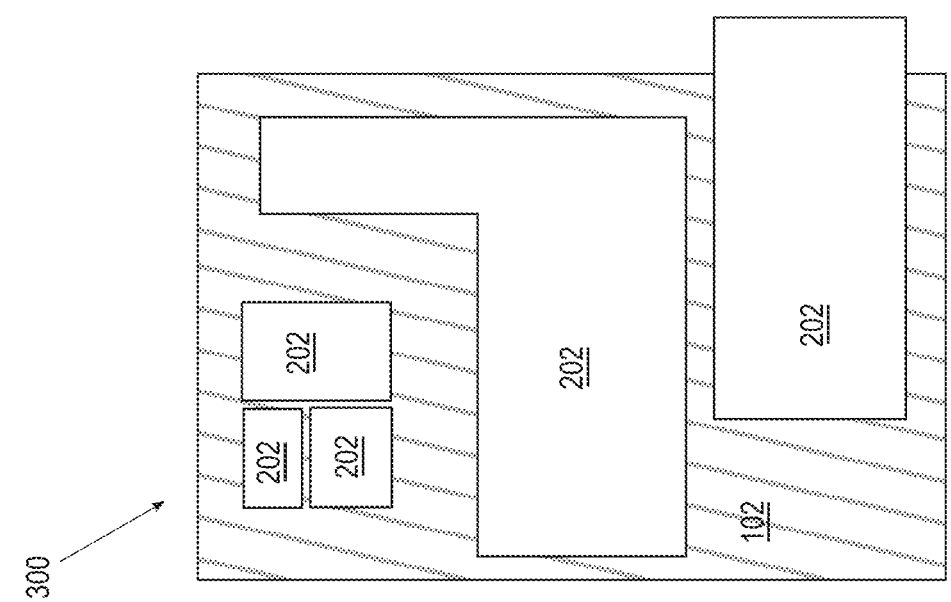

FIGS. 3A and 3B are simplified block diagrams illustrating example configurations 300 and 310 of IP die 202 over base die 102. As shown in FIG. 3A, in some embodiments with configuration 300, IP die 202 may be of any suitable shape and size appropriate for the particular circuits therein. Such different sized and shaped IP dies 202 may be placed appropriately over base die 102 and coupled thereto with DTD interconnects 218 (not shown) accordingly patterned. In such configuration 300, one or more (or none) of IP dies 202 may overhang base die 102, i.e., extend beyond a boundary of base die 102. The separation between adjacent IP dies 202 may be of the order of a few tens of micrometers, comparable to that between two IP cores within a monolithic SOC. In another configuration 310 as shown in FIG. 3B, all IP dies 202 placed over base die 102 may be regularly shaped so as to fit neatly in an array within the boundaries of base die 102. Such a regular arrangement may simplify routing over a NOC. In some embodiments, the server architecture comprising microelectronic assembly 100 may comprise a plurality of base dies 102 and IP dies 202 in configuration 300 entirely, or configuration 310 entirely, or a mixture of both.

Figure 4:
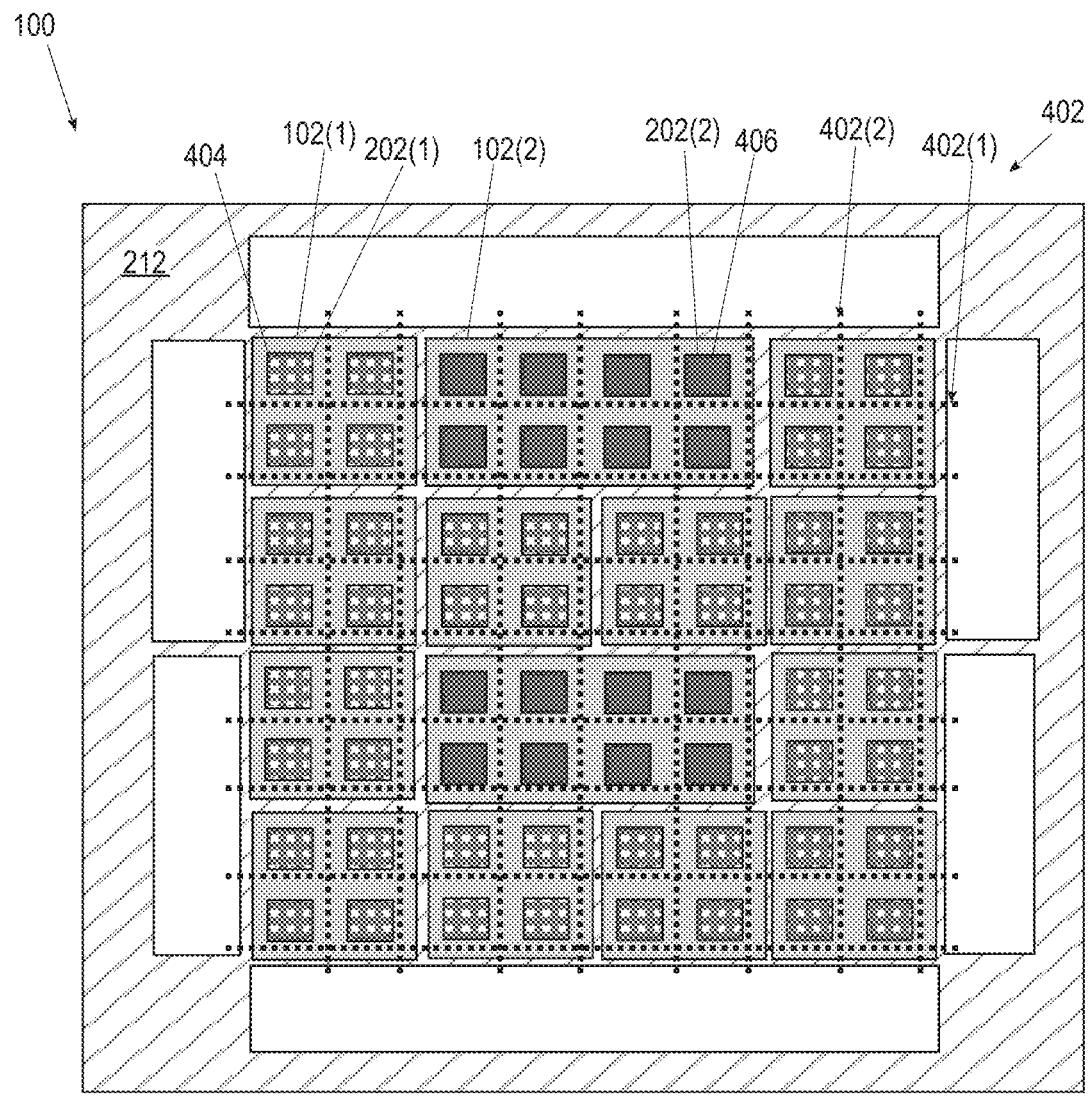
FIG. 4 is a simplified top view of another example microelectronic assembly, according to some embodiments of the present disclosure.

FIG. 4 is a simplified block diagram illustrating microelectronic assembly 100 for a processor (e.g., cellular processor, network processor, etc.) according to various embodiments. In the example embodiment shown, microelectronic assembly 100 comprises a first array of base dies 102 and a second array of IP dies 202 over the first array. IP dies 202 may be sized and shaped so that the second array of IP dies 202 fits over the first array of base dies 102. Microelectronic assembly 100 may comprise a NOC 402 that links various IP cores of the plurality of IP dies 202 in first layer 206. A first portion of IP dies 202 (e.g., 202(1)) may comprise general-purpose processor circuitry 404 and a second portion of IP dies 202 (e.g., 202(2)) may comprise accelerator circuitry 406. Base dies 102 may comprise support circuits supporting general-purpose processor circuitry and accelerator circuitry.

Cellular (e.g., 5G, 6G, etc.) and network processors (e.g., datacenters, backbone, etc.) in general require very high-speed processing of specific workloads. These may include specific digital signal processing (DSP) functions or lookup table search functions. General-purpose processors can perform many of these functions, but they are not as fast, power efficient, or cost efficient. Custom application specific ICs (e.g., ASICs) instead of general-purpose processors may be used to resolve this problem, but this is generally an expensive solution and does not benefit from the economy of scale of general-purpose processors. Furthermore, new ASICs require custom platforms and new software stacks that may be expensive and time consuming to develop and deploy.

Adding monolithically integrated accelerators to general-purpose processors can resolve this problem. In a general sense, an accelerator is a separate architectural substructure (on the same IC die, or on a different IC die) comprising a hardware engine for one or more specific tasks, such as offloading cryptographic functions, compression and decompression, regular expression (RegEx) processing, data storage functions, and networking operations. Thus, the accelerator is configured (e.g., tuned, designed) to provide higher performance at lower cost, at lower power, or with less development effort than with the general-purpose processor. Accelerators can have macroarchitectures that span from fixed-function, special-purpose chips to highly programmable engines configured for a particular domain of applications. Accelerators also tend to use specialized, fixed-function hardware for frequent, regular computation. Examples of accelerators include floating-point coprocessors, GPUs to accelerate the rendering of a vertex-based 3D model into a two-dimensional (2D) viewing plane, and accelerators for the motion estimation step of a video codec. As such, the accelerator is added to the system to achieve greater functionality or performance.

Adding monolithically integrated accelerators to general-purpose processors employs benefits from existing ecosystems and platforms for general-purpose processors to reduce the cost and time to market. Furthermore, it benefits from the high-speed on-die connections within the processor that enables fast communication between the accelerator and the processor. However, this approach is limited by monolithic die sizes and requires high effort to integrate the accelerator with the general-purpose processor (e.g., tapeout and accelerator fit within the processor die floorplan). Likewise, many accelerators can achieve highest power efficiency by targeting a lower power silicon process (e.g., achieving high performance through a high degree of data level parallelism), while general-purpose processors typically target a higher power, high-performance silicon process. Furthermore, any changes to the accelerators require a new tapeout of both the accelerator and the general-purpose processor.

In-package integration of the accelerator and the general-purpose processor is yet another alternative, for example, through on-package high-speed routing or through advanced packaging technologies such as Intel's EMIB™ or Foveros™ technology. This enables separating the accelerator and the general-purpose processor dies for more modular integration of the accelerators that enables connecting different accelerators to the same general-purpose processors or vice versa. However, this approach suffers from the higher power limited bandwidth of conventional 2D/2.xD on-package interconnects that results in higher latency and slower and less power efficient processing.

A common approach of integrating accelerators with a server SOC on-package includes using a general-purpose processor chip consisting of several processing cores that communicate together and to other system components through a NOC. The networking/DSP operations are done through sending the data from the processing cores or on-chip memory controller through the NOC over the inter-die connections over bridge dies, package traces, interposer, etc. The data is then received by the accelerator chiplet, processed, and then sent back to the processor die. This enables modular upgrades of each component (e.g., processor, accelerator) without the need for designing and taping out a new die.

However, this approach suffers from energy efficiency and latency limitations, especially for large core count processors and/or disaggregated processors, in which a significant portion of the data (e.g., the data to be later processed through the cores or memory controllers farthest from the accelerator) will need to travel a relatively long distance to reach the accelerator. This results in several problems including: (1) the long on-die travel distance results in added latency and more consumed power and (2) may result in on-die network congestion that may impact the quality of service.

Some embodiments of microelectronic assembly 100 can provide a possible solution to the problems discussed above by using near-monolithic integration of custom network accelerators which can enable addressing many more markets using the same platform. Furthermore, it enables mix and match of different accelerators and general-purpose processors with negligible impact on performance. Microelectronic assembly 100 comprises a server architecture comprising finely disaggregated general-purpose processors and accelerators. Such an architecture is not efficient with currently available technologies since they result in significant area, power and latency overheads when splitting a system into several smaller chiplets. However, with the techniques as described herein, including hybrid bonding having silicon-level interconnect density greater than 10,000 connections per square millimeter and quasi-monolithic architecture with at least three stacked layers of IC dies, microelectronic assembly 100 may have much lower overheads almost close to a monolithic SOC.

In various embodiments, NOC 402 is suitably designed in the complex SOC architecture of microelectronic assembly 100 such that IP core placement and other aspects of chip design is made easier and optimization of connection topologies are permitted. An example server architecture using microelectronic assembly 100 may comprise two different types of IP cores: general-purpose processor circuitry 404 in IP die 202(1); and accelerator circuitry 406 in IP die 202(2). IP die 202(2) with the accelerator circuitry 406 is dispersed (e.g., inter-dispersed) among IP die 202(1) with the general-purpose processor circuitry 404 either as coplanar chiplets, chiplets attached on the bottom of IP die 202(1), similar to bridge die 104, or in an interposer configuration, for example in base die 102. The system-in-package embodied in microelectronic assembly 100 may further comprise two parallel NOCs 402, a first NOC 402(1) for communication between the general-purpose processors 404 and accelerators 406 and a second NOC 402(2) for communication between general-purpose processors 404 only.

NOC 402 may comprise interconnections through one or more layers 206, 208 and 210 as well as within a single one of layers 206, 208 and 210. Accelerator circuitry 406 of IP die 202(2) and/or their associated connectivity infrastructure support transparent pass-through of NOC packets generated by general-purpose processor circuitry 406. This allows general-purpose processor circuitry 406 to communicate with each other for other workloads, without involving accelerator circuitry 406. Note that NOC 402, including 402(1) and 402(2) are generally indicated in the simplified figure and do not correspond to specific NOC couplings. The parallel configuration of NOC 402 may allow more customization and performance benefits than is possible with only a single NOC. It also decouples the general-purpose NOC design of NOC 402(2) from the accelerator specific NOC design of NOC 402(1). However, such decoupling may come at the expense of additional (e.g., replicated) routing resources to support both NOCs 402(1) and 402(2).

While accelerator circuitry 406 and general-purpose processor circuitry 404 in IP die 202(2) and IP die 202(1) respectively may be manufactured using different silicon processes, accelerator circuitry 406 and general-purpose processor circuitry 404 are designed to tile together, which enables customization for different workloads. IP dies 202(1) and 202(2) comprising general-purpose processor circuitry 404 and accelerator circuitry 406 need not be the same size, although they are shown in the figure as being similarly shaped and sized. Thus, in some embodiments, IP die 202(1) comprising general-purpose processor circuitry 404 may be of similar size and shape as IP die 202(2) comprising accelerator circuitry 406; in other embodiments, IP die 202(1) comprising general-purpose processor circuitry 404 may not be of similar size and shape as IP die 202(2) comprising accelerator circuitry 406.

IP die 202 may, however, be shaped and/or sized according to the underlying size and shape of base die 102, for example, to facilitate uniform and/or regular connections for NOC 402 through base die 102. For example, IP die 202 may be of a first size, base die 102 may be of a second size, and the second size is approximately such that multiple ones of IP die 202 can be contained over a single one of base die 102 without any overhang (i.e., extending over a boundary of base die 102). Thus, all DTD interconnects 218 (not shown) between IP die 202 and base die 102 may be fully contained within a boundary of base die 102 (with or without any redistribution layers (RDL) therebetween). Further, base die 102(1) supporting IP die 202(1) having general-purpose processor circuitry 404 may be differently sized than base die 102(2) supporting IP die 202(2) having accelerator circuitry 406. Thus, a different number of IP die 202(1) may be attached to base die 102(1) compared to a number of IP die 202(2) attached to base die 102(2) in some embodiments.

In various embodiments, base dies 102 comprise support circuitry for general-purpose processor circuitry 404 and accelerator circuitry 406. Support circuits for general-purpose processor circuitry 404 may comprise memory controllers, cache, clock circuits, etc. Support circuits for accelerator circuitry 406 may comprise dedicated memory registers, data routers, and the like. In some embodiments, base die 102(1) attached to IP dies 202(1) having general-purpose processor circuitry 404 may comprise support circuitry configured particularly for general-purpose processor circuitry 404, whereas base die 102(2) attached to IP dies 202(2) having accelerator circuitry 406 may comprise support circuitry configured particularly for accelerator circuitry 406. In other embodiments, base dies 102(1) and 102(2) may comprise support circuitry for both general-purpose processor circuitry 404 and accelerator circuitry 406, and thus may be interchangeable.

Figure 5:
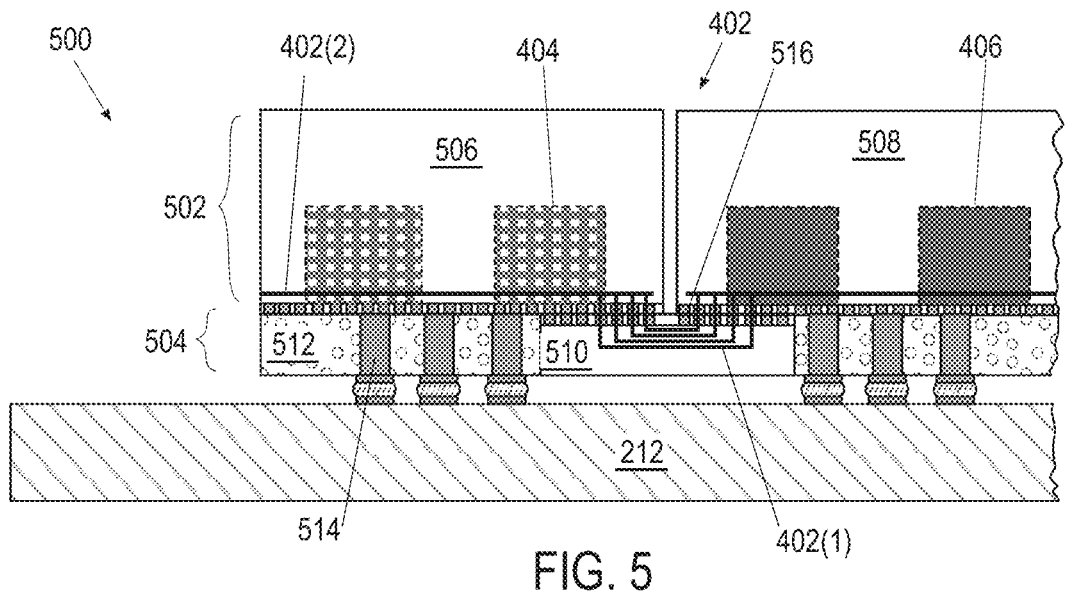
FIG. 5 is a simplified cross-sectional view of yet another example microelectronic assembly, according to some embodiments of the present disclosure.

FIG. 5 is a simplified cross-sectional view of a microelectronic assembly 500 comprising two layers 502 and 504. Layer 502 comprises IC dies 506 and 508, having general-purpose processor circuitry 404 and accelerator circuitry 408, respectively. Layer 504 comprises a bridge die 510, proving electrical coupling between IC die 506 and 508. In some embodiments, bridge die 510 may comprise active devices; in other embodiments, bridge die 510 may not comprise active devices. In some embodiments, bridge die 510 may comprise an interposer. Bridge die 510 may be embedded in, or surrounded by, a dielectric 512 having TDVs 514. In some embodiments, dielectric 512 may comprise the same material as dielectric 232 and/or 244. Some embodiments of microelectronic assembly 500 may permit modularity through common interfaces and tile-able chiplet sizes (e.g., 10 square millimeters) for IC dies 506 and 508, and high performance through the use of hybrid bonding connections and interposer architectures between layers 502 and 504 to minimize the inter-die connections overheads on area, power, and latency.

NOC 402 in microelectronic assembly 500 may comprise first NOC 402(1) for communication between general-purpose processor circuitry 404 in IC die 506 and accelerator circuitry 406 in IC die 508, and second NOC 402(2) for communication between general-purpose processor circuitry 404 within IC die 506. Sizes of IC dies 506 and 508 may be tailored for the number of general-purpose processor circuitry 404 and accelerator circuitry 406 respectively in each of them. DTD interconnects 516 between bridge die 510 and IC dies 506 and 508 comprise hybrid bonds (e.g., metal-on-metal and oxide-on-oxide bonds), reducing latency and permitting silicon-level interconnect density.

Figure 6:
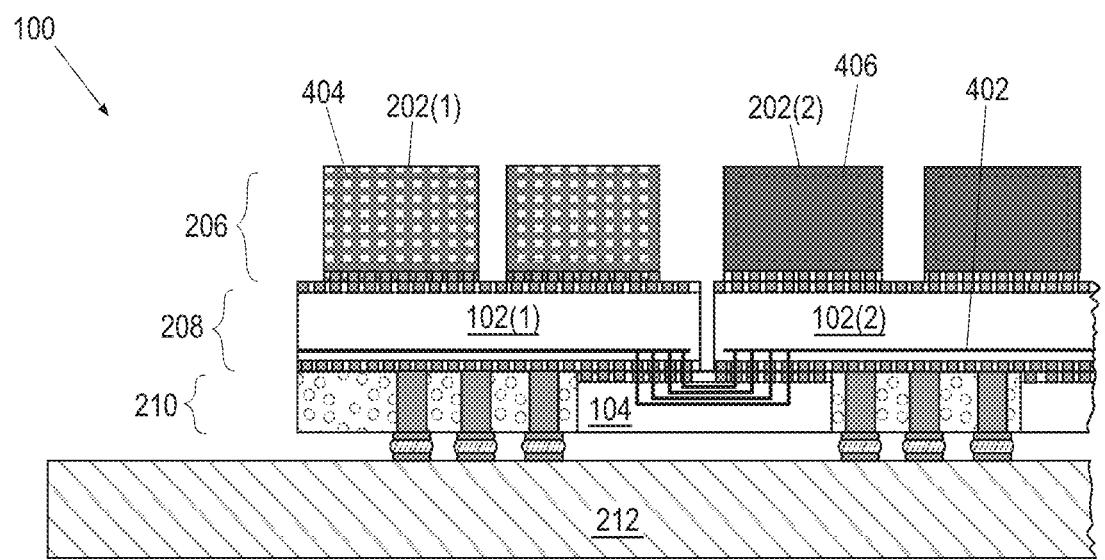
FIG. 6 is a simplified cross-sectional view of a portion of the example microelectronic assembly of FIG. 4, according to some embodiments of the present disclosure.

FIG. 6 is a simplified cross-sectional view of microelectronic assembly 100 comprising three layers: first layer 206, second layer 208 and third layer 210. IP die 202(1) may comprise general-purpose processor circuitry 404 and IP die 202(2) may comprise accelerator circuitry 406 as shown in the example embodiment. In other embodiments, IP die 202(1) may comprise more than one general-purpose processor circuitry 404; likewise, IP die 202(2) may comprise more than one accelerator circuitry 406. NOC 402 in such embodiments may be provisioned through base die 102 (e.g., 102(1) and 102(2)), with interconnections between adjacent base dies 102 (e.g., 102(1) and 102(2)) through bridge die 104. In some embodiments, base die 102 (e.g., 102(1) or 102(2)) may also comprise one or more of general-purpose processor circuitry 404 and/or accelerator circuitry 406. In some embodiments, base die 102(1) coupled to IP die 202(1) having general-purpose processor circuitry 404 may be substantially identical with base die 102(2) coupled to IP die 202(2) having accelerator circuitry 406. In other embodiments, base die 102(1) coupled to IP die 202(1) having general-purpose processor circuitry 404 may be different from base die 102(2) coupled to IP die 202(2) having accelerator circuitry 406, for example, to support faster feedthrough or for more advanced routing.

Figure 7A:
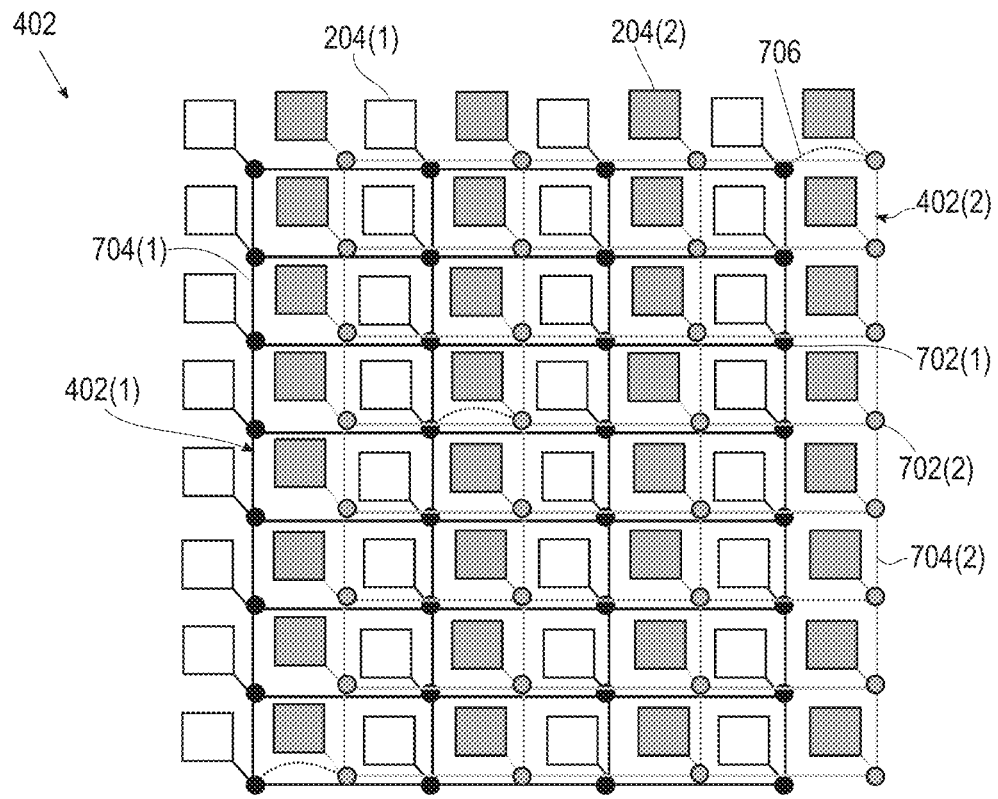
FIGS. 7A-7B are schematic block diagrams of different network on chip configurations in a microelectronic assembly, according to some embodiments of the present disclosure.
Figure 7B:
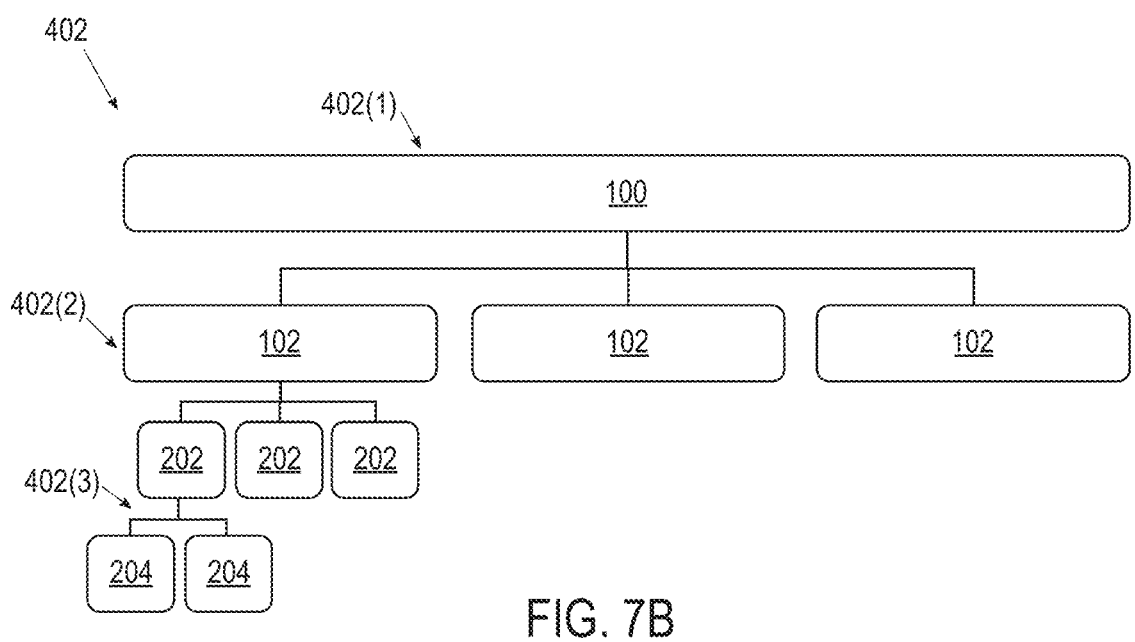

FIGS. 7A and 7B are simplified block diagrams of a NOC 402, according to various embodiments. As shown in FIG. 7A, NOC 402 may couple together various IP cores 204 in one or more networks in microelectronic assembly 100. NOC 402 may comprise a first NOC 402(1) and a parallel second NOC 402(2). For ease of explanation, NOC 402(1) and 402(2) are shown in different shading to distinguish one from the other. Certain IP cores 204, for example, 204(1) may be interconnected over NOC 402(1), whereas certain other IP cores 204, for example, 204(2) may be interconnected over NOC 402(2). Although not shown specifically, some IP cores 204 may be interconnected over more than one NOC. Note that while only two parallel NOCs are shown, any number of NOCs feasible for microelectronic assembly 100 may be provisioned therein within the broad scope of the embodiments. In some embodiments, each IP core 204 may be provisioned on a separate IP die 202; in other embodiments, a single IP die 202 may comprise more than one IP cores 204; in yet other embodiments, a single IP core 204 may be distributed over multiple IP dies 202.

Also, while a mesh topology is shown for NOC 402, any suitable topology, including torus, ring, star, etc. as well as combination of different topologies may be encompassed within the broad scope of the embodiments. For example, in some embodiments, NOC 402(1) may comprise a mesh topology, whereas NOC 402(2) may comprise a ring topology; in other embodiments, NOC 402(1) may comprise a torus topology, whereas NOC 402(2) may comprise a mesh topology; and so on. Each of NOC 402(1) and 402(2) may comprise router circuits 702, for example 702(1) and 702(2) respectively, and links 704, for example, 704(1) and 704(2), respectively that provide suitable communication channels. Note that "link" as used herein refers to a communication channel, and not necessarily a physical connection such as a metal trace. Certain sparse links 706 may connect NOC 402(1) and NOC 402(2) sparsely, to enable communication between NOC 402(1) and 402(2). These few connections comprised of sparse links 706 may be used only when data traverses between networks, so initial planning of the connections may be important to ensure proper utilization and bandwidth distribution. Coupling NOC 402(1) and 402(2) using sparse links 706 instead of dense connections may serve to conserve resources in microelectronic assembly 100.

In various embodiments, IP cores 204 are coupled to router circuits 702 by links 704, each link 704 comprising a number of interconnections between the IP dies 202 and base dies 102, and at least two links 704 are conductively coupled together at a node. The interconnections forming links 704 may comprise a plurality of conductors. In some embodiments, the node forms a junction of mutually orthogonal pluralities of conductors.

Although not shown so as not to clutter the drawing NOC 402 may comprise additional elements, for example, a network interface placed at the edge of each IP core 204 and on-chip interfaces such as high-definition multimedia interface (HDMI), I2C, USB, and universal asynchronous receiver-transmitter (UART). The network interface packetizes data (e.g., digital signals) generated by IP core 204 and sends the packets to router circuits 702 that buffer the packets from IP core 204 or from other connected router circuits. The network interface facilitates the modular architecture of microelectronic assembly 100 and ensures seamless communication between different IP cores 204 on one or more of IP die 202 with related housekeeping operations, irrespective of their communication protocol.

It may be noted that the NOC topology denotes a physical organization of a network architecture and does not necessarily reflect the physical layout realized on one or more IC dies. In the mesh topology as illustrated, each router circuit 702 is connected to one IP core 204 and four neighboring router circuits through links 704. With mesh topology, a huge number of IP core 204 in the plurality of IP dies 202 can be incorporated in a regular-shape structure, allowing for scalability and path diversity. Communication among various IP cores 204 can be achieved using appropriate algorithms for routing communication packets from the source to the destination nodes on NOC 402. In this context, suitably routing algorithms for efficient and correct packet routing may be employed at router circuits 702, with packet switching and circuit switching or any combination thereof.

In traditional planar die configurations, there is competition for routing resources between the general-purpose processors and accelerators and global interconnects needed for distributing high bandwidth low latency connections across the die. By using the modular interposer approach enabled by the quasi-monolithic packaging architecture as disclosed herein, resources on base die 102 may be utilized for the global high-bandwidth interconnects. Thus, according to various embodiments, router circuits 702 and many of links 704 may be located in one or more of base die 102. With the sparsely connected parallel networks NOC 402(1) and 402(2), any bandwidth competition between inter-die communication and connected chiplet-to-chiplet global communication may be eliminated or reduced significantly.

As shown in FIG. 7B, NOC 402 may further comprise several hierarchical parallel NOCs 402(1), 402(2), 402(3) and 402(3) (among others). For example, NOC 402(1) may comprise a global network spanning the entirety of microelectronic assembly 100. Multiple base dies 102 may communicate with each other over NOC 402(1). Links and router circuits of NOC 402(1) may be realized using the plurality of base dies 102 and bridge dies 104.

NOC 402(2) may comprise an intermediate network spanning each separate base dies 102. Multiple IP dies 202 coupled to corresponding base die 102 may communicate with each other over NOC 402(2). Links and router circuits of NOC 402(2) may be realized using the plurality of base dies 102 and IP dies 202, and in embodiments where two or more IP dies 202 are coupled to the same base die 102 over bridge die 104, the links and router circuits of NOC 402(2) may be realized using such bridge die 104 as well. NOC 402(2) may couple to NOC 402(1) with link 706, in some embodiments.

NOC 402(3) may comprise an intra-die network spanning each separate IP die 202. In embodiments where IP die 202 comprises more than one IP core 204, NOC 402(3) may enable communication between separate IP cores 204 in same IP die 202. Links and router circuits of NOC 402(3) may be realized using metal traces and vias within IP die 202. NOC 402(3) may couple to NOC 402(2) and/or NOC 402(1) with link 706, for example. By separating networks along die boundaries as described herein, modular parallel hierarchical networks may be provisioned in microelectronic assembly 100.

FIGS. 8A and 8B are simplified block diagrams of NOC configurations of a portion of microelectronic assembly 100. According to various embodiments, the bulk of router circuits 702 and links 704 of NOC 402 may be realized in base dies 102, and IP dies 202 may be attached to individual NOCs, for example, 402(1) or 402(2) with appropriate connections to base dies 102 based on size and bandwidth requirements of respective IP dies 202. In a physical (e.g., structural) sense, NOC 402 may be realized in microelectronic assembly 100 with node 802 representing junctions of various interconnections 804, 806 and 808 as shown in FIG. 8A. For example, consider node 802(1) belonging to NOC 402(1). Node 802(1) comprises a junction of three different interconnections: interconnection 804(1), denoted by dashed lines, representing in-layer coupling with other nodes in same NOC 402(1); interconnection 806, denoted by dotted lines, representing in-layer coupling with other nodes in different NOC 402(2); and interconnection 808(1), denoted by an arrow, representing out-of-layer coupling with IP die 202 in same NOC 402(1). One or more such nodes and interconnections within NOC 402(1) may form link 704 suitably. Interconnection 806 may form part of link 706.

Interconnections 804 and 806 may be realized through metal pathways (e.g., metal traces and vias), for example, in metallization stack 222 and TSV 224 of base die 102. Interconnection 808 may be realized by DTD interconnects 218, for example, hybrid bonds (e.g., metal-to-metal and oxide-to-oxide bonds) between base die 102 and IP dies 202, along with vias and metal traces in either die as appropriate. In some embodiments, interconnections 804, 806 and 808 may also be realized by DTD interconnects 230 between base die 102 and bridge die 104, metal traces and vias in metallization stack 238 and TSV 242 of bridge dies 104.

In various embodiments, a cache 810 may be located in base die 102 and distributed in some embodiments across the array of base dies 102, and accessible by one or more IP dies 202 connected thereto. In some embodiments, by associating cache 810 on base die 102 to the local network, for example, connected to just those of IP die 202 directly coupled thereto, and reducing the size of the network cluster (e.g., from substantially all IP die 202 in microelectronic assembly 100), latency required for a cache lookup may be reduced. In some embodiments, cache 810 may be accessible by other IP dies 202 in first layer 206 that is not directly coupled to base die 102 which hosts cache 810. In some embodiments, cache 810 may be distributed over a plurality of base dies 102, accessible to some or all of IP die 202 in microelectronic assembly 100. In some embodiments, NOC 402 could be divided into separate networks (e.g., NOC 402(1), NOC 402(2), etc.) at die boundaries and associated to separate socket IDs or combined into larger clusters.

As shown in FIG. 8B, one or more IP die 202 may be coupled to the appropriate NOC with interconnections 808. For example, IP die 202(1) may be coupled to NOC 402(2) by nodes 802(2) and interconnections 808(2). In the example embodiment shown, four nodes 802(2) are utilized to couple to NOC 402(2), allowing for four times more bandwidth than available with a single node. The combination of four nodes 802(2) and four interconnections 808(2) may represent a single link 704 connecting IP core 204 (not shown) comprised in IP die 202(1) with a router circuit (not shown) in base die 102. Although nodes 802(1) belonging to parallel NOC 402(1) on base die 102 are available for interconnection under IP die 202(1), such nodes may not be used for electrical coupling in the example embodiment as a particular IP core 204 in IP die 202(1) is not connected to NOC 402(1) based on design parameters and other considerations. Although hybrid bonds may be present at such locations for mechanical strength, the bonds may be electrically isolated and/or unused for coupling to NOC 402. On the other hand, if a particular IP core 204 is to be coupled to both NOC 402(1) and 402(2), such available nodes may be used for coupling suitably.

IP die 202(2) and IP die 202(3) may be likewise coupled to NOC 402(1) by nodes 802(1) and interconnections 808(1). Nodes 802(2) belonging to NOC 402(2) may remain electrically uncoupled to IP die 202(2) and 202(3). In the example embodiment shown, two of nodes 802(1) are utilized to couple to NOC 402(1) in each of IP die 202(2) and 202(3), with twice the bandwidth as would be obtained with a single node and half the bandwidth as would be obtained with 4 nodes (e.g., as in IP die 202(1)).

Figure 8C:
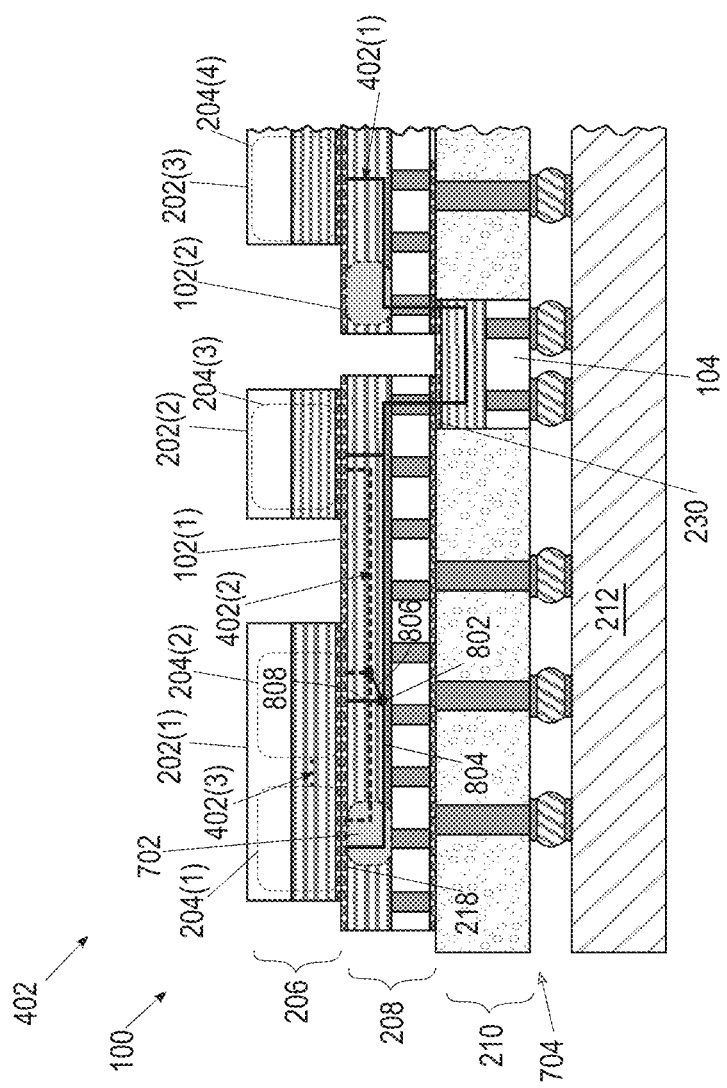
FIG. 8C is a simplified cross-sectional view of an example network on chip in a portion of a microelectronic assembly, according to some embodiments of the present disclosure.

FIG. 8C is a simplified cross-sectional view of an example NOC 402 according to various embodiments. In the example embodiment shown, microelectronic assembly includes IP cores 204(1), 204(2) in IP die 202(1); IP core 204(3) in IP die 202(2); and IP core 204(4) in IP die 202(3). IP dies 202(1) and 202(2), are attached to base die 102(1); IP die 202(3) is attached to base die 102(2). IP dies 202(1), 202(2) and 202(3) are in first layer 206. Base dies 102(1) and 102(2) are in second layer 208. Bridge die 104 in third layer 210 couples base dies 102(1) and 102(2). NOC 402 couples IP cores 204(1), 204(2), 204(3) and 204(4) in various ways, for example, three parallel subnetworks NOC 402(1), NOC 402(2), and NOC 402(3). NOC 402(1) couples IP cores 204(1), 204(2), 204(3) and 204(4) by way of base dies 102(1) and 102(2) and bridge die 104. NOC 402(2) couples IP cores 204(1) and 204(2) with IP core 204(3) through base die 102(1). NOC 402(3) couples IP cores 204(1) and 204(2) within IP die 202(1).

Node 802 in base die 102 at second layer 208 belonging to NOC 402(1) may comprise a connection point of three different interconnections: 804 representing in-layer coupling with other nodes in same NOC 402(1); interconnection 806, representing in-layer coupling with other nodes in different NOC 402(2); and interconnection 808, representing out-of-layer coupling with IP die 202 in same NOC 402(1). Interconnection 804 may traverse metal traces and vias in base dies 102(1) and 102(2) as well as metal traces and vias in bridge die 104 along with DTD interconnects 230 between layers 208 and 210. Likewise, interconnection 806 may traverse metal traces and vias in base dies 102(1) and 102(2) as well as metal traces and vias in bridge die 104 along with DTD interconnects 230 between layers 208 and 210. Interconnection 806 may traverse metal traces and vias in base die 102(1), IP die 202(1) and DTD interconnects at interface between layers 206 and 208. Node 802 and interconnects 804, 806 and 808 may comprise parts of links 704 (and/or sparse links 706).

Router circuits 702 may be provisioned in layer 210, for example, base dies 102(1) and/or 102(2), forming a mesh across microelectronic assembly 100. In some embodiment, even intra-die NOCs, such as NOC 402(3) may use router circuits 702 provisioned in layer 210, for example, in base dies 102(1) and 102(2). Having such network resources provisioned in layer 210 frees up die area in IP dies 202(1)-202(4).

Although only three networks are described, various other NOC structures and topologies are also possible within the broad scope of the embodiments. For example, IP core 204(1) may be coupled to IP core 204(4) in a parallel network to NOC 402(1); IP core 204(1) and 204(3) may be coupled in a parallel network to NOC 402(3); and so on. Thus, networks may be subdivided based on die boundaries in some embodiments; in other embodiments, the subnetworks may be formed at functional boundaries, for example, all memory cores may be coupled over one subnetwork, while all cores may be coupled over another subnetwork, and so on. Any suitable network configuration may be used within the broad scope of the embodiments.

Figure 9:
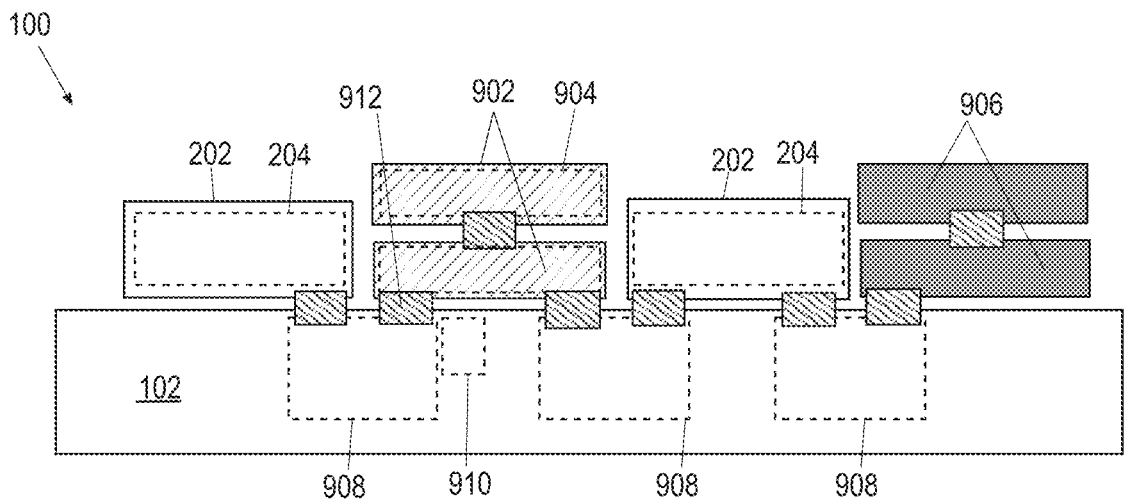
FIG. 9 is a block diagram of a microelectronic assembly comprising IC dies made of more than one different process, according to embodiments of the present disclosure.

FIG. 9 is a simplified block diagram illustrating an example embodiment of microelectronic assembly 100 with multiple layers and comprising a hybrid collection of dies, some fabricated using traditional CMOS processes and others fabricated using "beyond-CMOS" processes. Beyond-CMOS dies as used herein comprise dies made using processes that are not CMOS. Typically, beyond-CMOS dies use spin, phase, multipole orientation, mechanical position, polarity, orbital symmetry, magnetic flux quanta, molecular configuration, and other quantum states instead of electron charge to specify a computational state. An example of a beyond-CMOS die includes a spin-transistor (e.g., Spin FET, Spin MOSFET transistor) that has a ferromagnetic source and ferromagnetic drain functioning as spin injector and detector, respectively, and behave as a transistor while functioning as a magneto-resistive device. Another example of a beyond-CMOS die is a spin-wave device, comprising a type of magnetic logic device exploiting collective spin oscillation for information transmission and processing.

As used herein, the term "beyond-CMOS process" refers to any manufacturing process used in semiconductor technologies with ferromagnetic materials, ferroelectric materials, piezoelectric materials, piezoresistive materials, magnetostrictive materials, or equivalents, for example, half-metallic ferromagnetic materials, materials with strong spin-orbit interaction, such as indium-gallium-arsenide (InGaAs), indium arsenide (InAs), indium-antimonide (InSb), correlated electron materials, such as vanadium dioxide, lead magnesium niobate-lead titanate, nickel, high-anisotropy magnetic materials, carbon nanotubes, graphene, polymer-based materials, strained germanium, silicon-germanium, oxides such as compounds of oxygen with at least one of aluminum, hafnium, tantalum, titanium, tungsten, and zirconium, conductive metals such as titanium, platinum, nickel, tungsten, conductive oxides such as perosvkites, macromolecular materials, low-density carbon, "Mott materials" such as $Pr_{1-x}Ca_xMnO_3$, $SmNiO_3$, $NiO$, $Ca_2RuO_4$, $NbO_2$, $AM_4X_8$ (A=Ga, Ge; M=V, Nb, Ta; X=S, Se), etc.

As CMOS transistor ICs are scaled according to Moore's law, the power dissipated in them grows above the capacity to remove heat. Also, the demand for computing operations in datacenters is growing exponentially with time. These two trends underscore the need to more energy-efficient computing chips, which may be realized through beyond-CMOS dies. The unique differences between operating voltages, power, etc. between CMOS and beyond-CMOS dies require novel packaging methods to interconnect them at a fine a scale to allow seamless data exchange between the two different kinds of devices. Presently, beyond-CMOS dies (such as tunnel FETs, 2D material FETs, ferroelectric FET, spintronic, piezoelectric, magnetoelectric) have only been demonstrated in small-scale circuits in unpackaged chips. Currently extant packaging methods, for example, based on standard bridge dies or similar architecture are not suitable for beyond-CMOS circuits that work at a lower voltage and slower clock frequency than CMOS circuits. In particular, the slower clock frequency translates to a larger number of parallel cores for computing and wide buses for carrying the data, both of which are not adequately realized in currently extant packaging methods, but which may be enabled with microelectronic assembly 100 as described in the present disclosure.

According to various embodiments, a plurality of IC dies, some fabricated using beyond-CMOS and others fabricated using CMOS may be physically, conductively, and communicably coupled to a relatively larger base die 102 that provides collective support circuits used by the plurality of conductively coupled IP cores. Example support circuits may include, but is not limited to, voltage regulation circuits, input/output circuits, data storage circuits, clock circuits, power delivery network circuits, etc. Typical heterogeneous integration techniques such as using bridge dies and silicon interposers have relatively low vertical interconnect density. In contrast, hybrid bonding with multiple layers of a quasi-monolithic architecture can enable much higher silicon-level interconnect density that can support forming on-chip high-bandwidth networks through the different layers. This is particularly important for IC dies formed using beyond-CMOS processes.

In an example embodiment, microelectronic assembly 100 may comprise one or more IP dies 202 coupled to base die 102, IP dies 202 and base die 102 being fabricated using traditional CMOS processes. In an example embodiment, IP die 202 may comprise IP core 204 (also sometimes referred to as CMOS IP core 204 in this and succeeding figures to distinguish from IP cores made using beyond-CMOS processes) that functions as a processor circuitry; another IP die 202 may comprise another CMOS IP core 204 that functions as a memory. Various other types of CMOS IP cores 204 may be comprised in microelectronic assembly 100 within the broad scope of the embodiments. In addition, microelectronic assembly 100 may comprise one or more beyond-CMOS dies 902 comprising beyond-CMOS IP cores 904 including devices, circuits, etc. fabricated using processes other than CMOS. Such beyond-CMOS dies 902 may include, by way of examples and not as limitations, ferroelectric materials, and ferromagnetic materials, including nanomagnets, ferroelectric capacitors, and majority gates.

In some embodiments, microelectronic assembly 100 may also comprise one or more super-low voltage CMOS (SLVC) die 906 (also called advanced-very-low-voltage-CMOS (AVC), or advanced-ultra-low-voltage-CMOS (AUC)) coupled to base die 102. Other embodiments of microelectronic assembly 100 may not comprise any SLVC die 906. SLVC die 906 may also be stacked one on top of another in some embodiments.

Because a characteristic feature of beyond-CMOS dies (and SLVC dies) is their lower operating voltage (e.g., 0.2V or 0.35V) compared to traditional CMOS devices (e.g., 0.6V, 0.8V), hybrid systems such as that shown in the example embodiment comprising both CMOS dies and beyond-CMOS dies may use conversion circuits between these two different domains. For example, base die 102 may comprise a conversion circuit 908 that functions as a level shifter (LS) (e.g., a circuit that translates signals from one logic level or voltage domain to another, similar to a transformer in analog circuits), converting signals from 0.6V to 0.2V. In some embodiments, conversion circuit 908 for voltage conversion comprises a LS converting signals at a first voltage of 0.6V or 0.8V from CMOS IP dies 202 to signals at a second voltage of 0.2V for beyond-CMOS dies 902. Likewise, the LS may convert signals at the second voltage of 0.2V from beyond-CMOS dies 902 to signals at the first voltage of 0.6V or 0.8V for CMOS IP dies 202. In some embodiments, the LS may convert signals at a first voltage of 0.6V from CMOS IP dies 202 to signals at a second voltage of 0.35V for SLVC dies 906. Likewise, the LS may convert signals at the second voltage of 0.35V from SLVC dies 906 to signals at the first voltage of 0.6V or 0.8V for CMOS IP dies 202. In addition, conversion circuit 908 may also comprise a Serializer/Deserializer (SerDes) (e.g., for distributed data processing) that enables translating from a higher clock frequency of CMOS circuits to a lower clock frequency of beyond-CMOS circuits. The translated signals may then be forwarded to beyond-CMOS die 902. Another circuit block 910 comprising a voltage regulator may regulate power at low voltage to beyond-CMOS die 902 and/or SLVC die 906.

Note that although conversion circuit 908 and 910 are shown as circuits in base die 102, they may also be realized in separate IC dies coupled to base die 102, or IP dies 202, beyond-CMOS dies 902, and/or SLVC dies 906) as appropriate. For example, they may be incorporated into IC dies in an additional layer between IP dies 202 and base die 102, the layers being coupled with interconnects having silicon-level interconnect density.

A set of interconnects 912 may facilitate signals between components, including between two beyond-CMOS dies 902. In various embodiments, interconnects 912 may comprise hybrid bonds (e.g., metal-to-metal and oxide-to-oxide bonds) or other kinds of bonds with similar pitches and silicon-level interconnect density (e.g., 10,000-50,000 connections/mm$^2$) that facilitates voltage step-down (or step-up as needed) and larger number of connections for the slower clock frequency of beyond-CMOS die 902. In some embodiments, interconnects 912 between CMOS dies and beyond-CMOS dies may be realized in separate bridge dies 104 dedicated to providing high-bandwidth interconnections.

In addition, because beyond-CMOS die 902 operates at lower voltage and lower power, the heat generated therein may be lower than for CMOS devices, permitting vertical stacking of devices in a true 3D stack. Thus, multiple beyond-CMOS die 902 (and/or SLVC dies 906) may be stacked one on top of the other, each interconnected with interconnects 912 comprising hybrid bonds or equivalent, having silicon-level interconnect density. Microelectronic assembly 100 as described herein permits integrating CMOS dies and beyond-CMOS dies with high-density interconnects, allowing for different voltages, different clock frequencies, and an adjustment of bus widths (e.g., number of communication channels) between CMOS dies (e.g., 202) and beyond-CMOS dies (e.g., 902).

In particular, the wide bus widths may be facilitated by interconnects 912 having silicon-level interconnect density (e.g., greater than 10,000 connections per square millimeter). For example, conversion circuit 908 comprises a SerDes that changes a frequency of signals between a first frequency and a lower, second frequency and a LS that changes a voltage of signals between a first voltage and a lower, second voltage. CMOS IP die 202 operates on signals at the first frequency and first voltage and beyond-CMOS die 902 operates on signals at the second frequency and second voltage. Assuming that signals at the first frequency and first voltage traverse a first link provided by a first number of interconnects (e.g., providing the necessary bus width), signals at the second frequency and second voltage would necessarily need to traverse a wider bus (e.g., because of higher current), essentially a second link provided by a second number of interconnects, the second number being larger than the first number in proportion to the difference in scale between the first frequency and the second frequency. In traditional packages with low interconnect density, supporting the second number of interconnects on a conventional sized die may be infeasible; however, in embodiments of the present disclosure, the second number is facilitated by interconnects 912 having silicon-level interconnect density.

FIG. 10 is a simplified cross-sectional view of a microelectronic assembly 100 comprising CMOS and beyond-CMOS circuits according to embodiments of the present disclosure. In various embodiments, microelectronic assembly 100 may embody a server architecture. Microelectronic assembly 100 comprises at least three layers, 206, 208 and 210, and in some embodiments, another layer 920. Package substrate 212 may be coupled electrically and mechanically to layer 210. IP dies 202 and beyond-CMOS dies 902 may be comprised in layer 206 in the example embodiment shown. In some embodiments, layer 206 may comprise multiple layers of beyond-CMOS die 902 stacked one on top of another. Layer 920 may comprise bridge dies 104 providing interconnects 912 to beyond-CMOS die 902 in some embodiments. In other embodiments, layer 920 may comprise IC dies having conversion circuits 908 and 910 for voltage conversion, frequency shifting and voltage regulation between CMOS dies and beyond-CMOS dies (and/or SLVC dies). In some embodiments, layer 920 may be absent, and IP die 202 and beyond-CMOS die 902 may directly connect to base die 102 in layer 208. In some embodiments, layer 920 may be between layers 208 and 210. Additional layers with other IC dies may also be provided in other embodiments. Layer 208 may comprise a plurality of base dies 102, modularized into an array as described in reference to FIG. 1 and other figures of the present disclosure. Layer 210 may comprise a plurality of bridge dies 104 coupling any base die 102 to other adjacent base dies 102. Layer 210 may couple to a package substrate 212, PCB or other component as desired and based on particular needs.

The packaging scheme as illustrated has the following features: Modular system of CMPS IP core 204 (e.g., CMOS compute circuits) and beyond-CMOS IP core 904 (e.g., beyond-CMOS compute circuits) in IP die 202 and beyond-CMOS die 902, respectively in layer 206; translation (e.g., voltage and frequency) through interconnects 912 provided by bridge die 104 in layer 920 between layer 206 (e.g., comprising IP die 202 and beyond-CMOS die 902) and layer 208 (e.g., comprising base die 102), for example, for modularity and to interchangeably use CMOS circuits and beyond-CMOS circuits; integrated translation features (e.g., level shifter, SerDes, voltage regulator, etc.) inside base die 102; interconnects 912 realized through hybrid bonds between bridge die 104 in layer 920 and IC dies (e.g., IP die 202 and beyond-CMOS die 902) in layer 206 or through hybrid bonds directly with base die 102 (e.g., in the absence of layer 920). Some embodiments of microelectronic assembly 100 may facilitate various SOCs, such as CMOS core and beyond-CMOS accelerator; beyond-CMOS processor and CMOS I/O; beyond-CMOS and CMOS processors together with beyond-CMOS and CMOS memory registers; and so on.

Figure 11:
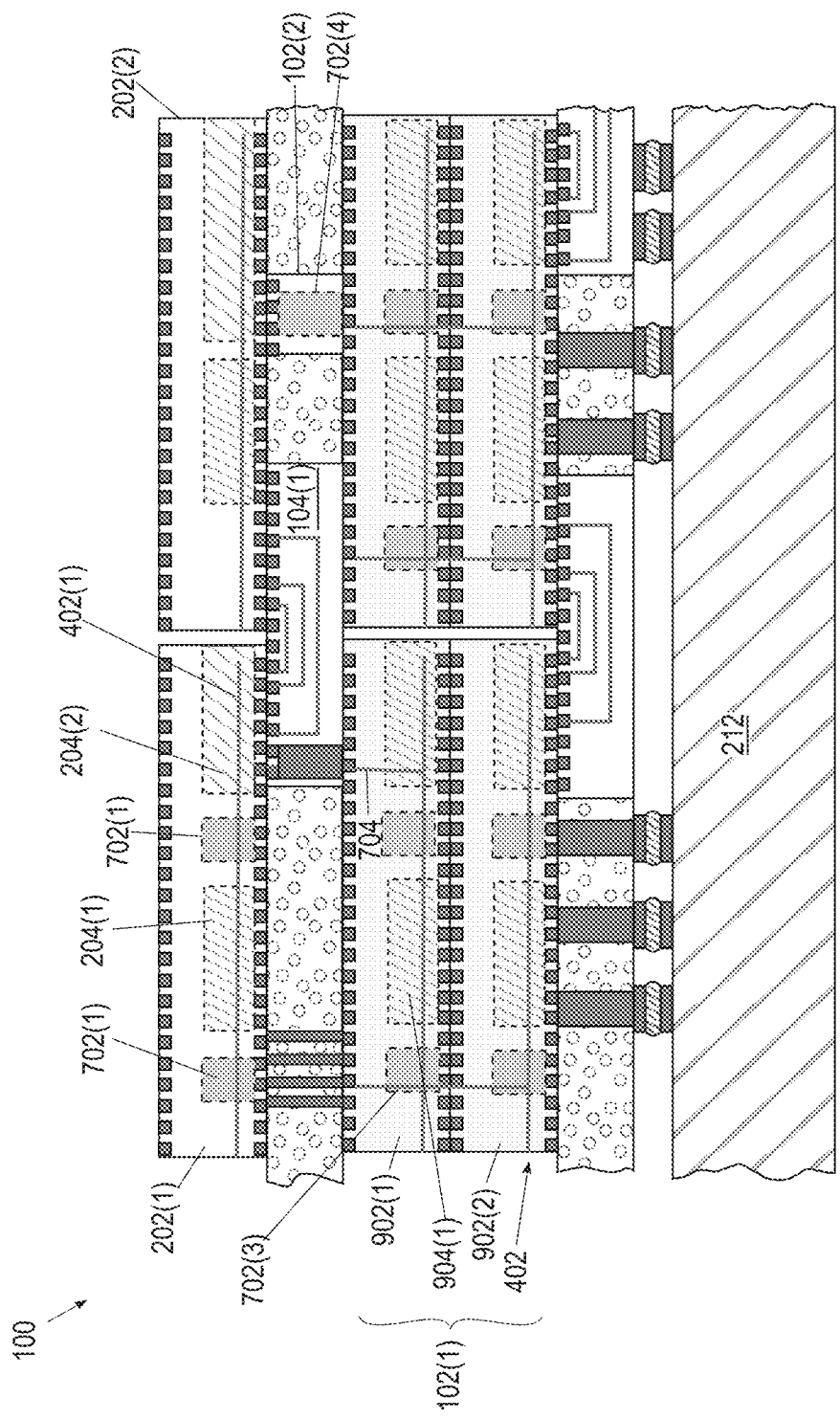
FIG. 11 is a simplified cross-sectional view of a network on chip in an example microelectronic assembly comprising IC dies made of more than one different process, according to embodiments of the present disclosure.

FIG. 11 is a simplified cross-sectional illustration of a portion of microelectronic assembly 100 comprising CMOS dies and beyond-CMOS dies in NOC 402 according to various embodiments. In a hybrid system as illustrated in the figure, microelectronic assembly 100 may comprise one or more IC dies (e.g., IP dies 202, base dies 102, bridge dies 104) fabricated using CMOS processes and one or more beyond-CMOS die 902 fabricated using processes that are not CMOS. In such 3D configurations, a large sized NOC 402 may be provisioned in microelectronic assembly 100 having a smaller sized footprint than is possible with traditional 2D configurations.

NOC 402 may comprise a 3D network spanning in-layer links and router circuits as well as out-of-layer links and router circuits as described further. Where traditional solutions positioned IC dies on a two-dimensional circuit board, the systems and methods described herein stack the IC dies in a 3D space, reducing the footprint, improving communication speed, and reducing power consumption. More specifically, the systems and methods disclosed herein dispose each IP core on a relatively small IC die.

beyond-CMOS dies can provide an energy-efficient alternative to heat generating CMOS transistor ICs, whose numbers scale according to Moore's law and number of computing operations demanded by datacenters today. Also, the demand for computing operations in datacenters is growing exponentially with time. As mentioned with regard to previous figures, novel packaging methods are required to combine CMOS and beyond-CMOS circuits together in a system and to allow them to work together while seamlessly exchanging information. Beyond-CMOS circuits are designed to work at lower supply voltages than CMOS circuits. Further, beyond-CMOS logic can permit 3D stacking of dies.

NOC 402 of microelectronic assembly 100 as described herein comprises CMOS dies and beyond-CMOS dies in different subnetworks that make use of hybrid bonding (or similar high-density interconnections) and quasi-monolithic packaging architecture, comprising multi-layers of IC dies. NOC 402 can enable multiple CMOS IP cores 204 operating in parallel with small interconnect length between them, for example, to compensate for slower clock speed in beyond-CMOS IP cores 904. Further, NOC 402 may utilize a much lower power dissipation per unit area in beyond-CMOS dies 902, which makes the heat removal via hybrid bonding sufficient for reliable operations. NOC 402 may accommodate different configurations consisting of multiple interconnected subnetworks to accommodate the local and global workloads within each subnetwork (also referred to as "cluster"). Beyond-CMOS dies 902 may be stacked in numbers significantly larger than one, thereby drastically increasing the device count per unit area (according to Moore's law) and the number of operations per second (TOPS) in overall microelectronic assembly 100. In an example embodiment, NOC 402 comprises a 3D mesh network configuration, utilizing high interconnect density available between IC dies both in the horizontal and vertical directions in the quasi-monolithic packaging architecture.

Some embodiments of NOC 402 allows for different arrangements of die stacks and varying number of beyond-CMOS dies 902 in each stack. Multiple CMOS IP cores 204 may connect to the same base die 102. Functionalities of base die 102 may be provided by beyond-CMOS die 902 in some embodiments. For example, beyond-CMOS dies 902(1) and 902(2) may together function as base die 102(1). In such embodiments, each IP core 204 has access to router circuits provided by multiple stacked beyond-CMOS dies 902 to realize different NOC structures (e.g., assuming each base die in the die stack has one router circuit of a corresponding NOC accessible to respective IP core 204). In some embodiments, TSVs may be provisioned in beyond-CMOS dies 902 and CMOS base dies 102 (e.g., 102(2)) to provide connectivity in an out-of-layer direction. Some of the beyond-CMOS die stacks may comprise cache (e.g., distributed last level cache (LLC)) or IP cores 904 (e.g., 904(1)). In some embodiments, NOC 402 may comprise hierarchical parallel subnetworks, for example, if there is a need to adjust the NOC to support connectivity.

In various embodiments, router circuits 702 may be provisioned in base die 102 (e.g., as described in reference to FIG. 7), and/or in other IP dies 202 having IP core 204 (and/or beyond-CMOS dies 902 having beyond-CMOS IP cores 904) within microelectronic assembly 100. In various embodiments, link 704 in NOC 402 coupling a beyond-CMOS die (e.g., 902(1)) with a CMOS IP die (e.g., 202(1)), fabricated using a process that is not beyond-CMOS, comprises circuitry (e.g., 908, 910, not shown) facilitating voltage regulation (e.g., VR), voltage level shifting (e.g., LS), and frequency shifting (or variation) (e.g., SerDes). In some embodiments, the circuitry may be located in the CMOS IP die (e.g., 202(1)) comprising a connected router circuit (e.g., 702(1)); in other embodiments, the circuitry may be located in another CMOS IC die (e.g., bridge die 104(1)) comprising an interconnection or bridging between the disparate IC dies (e.g., 202(1) and 902(1)).

In one example, IP die 202(1) may comprise IP core 204(1) (e.g., compute cores) and IP core 204(2) (e.g., memory), router circuit 702(1) and router circuit 702(2). Intra-die NOC 402(1) may facilitate communication between IP core 204(1) and IP core 204(2) through router circuit 702(2), for example. An example beyond-CMOS die 902(1) may comprise IP core 904(1) and router circuit 702(3). In some embodiments, IP core 904(1) may belong to same NOC 402(1) as IP core 204(1). IP core 204(1) in IP die 202(1) may communicate with IP core 904(1) in beyond-CMOS die 902(1) through router circuit 702(1) in IP die 202(1). Router circuit 702(1) in such embodiments may include or be coupled to appropriate circuit blocks, such as voltage regulator, level shifter and SerDes to translate signals between IP die 202(1) and beyond-CMOS die 902(1). In another example, IP die 202(2) may not be provisioned with any router circuit 702, instead using router circuit 702(4) provisioned in base die 102(2).

Although only a few NOC structures have been described in examples, it may be understood that numerous other types of NOC structures are possible with the combination of CMOS dies and beyond-CMOS dies according to the various embodiments of the present disclosure. For example, stacked beyond-CMOS dies 902 may not function as base dies 102 in some embodiments; in other embodiments, some of the beyond-CMOS dies 902 in a stack may function as base dies 102 whereas some others may not function as base dies 102. In some embodiments, all beyond-CMOS IP cores 904 may be part of a subnetwork whereas all CMOS IP cores 204 may be part of another subnetwork; in other embodiments, any one subnetwork may span both beyond-CMOS IP cores 904 and CMOS IP cores 204.

Figure 12:
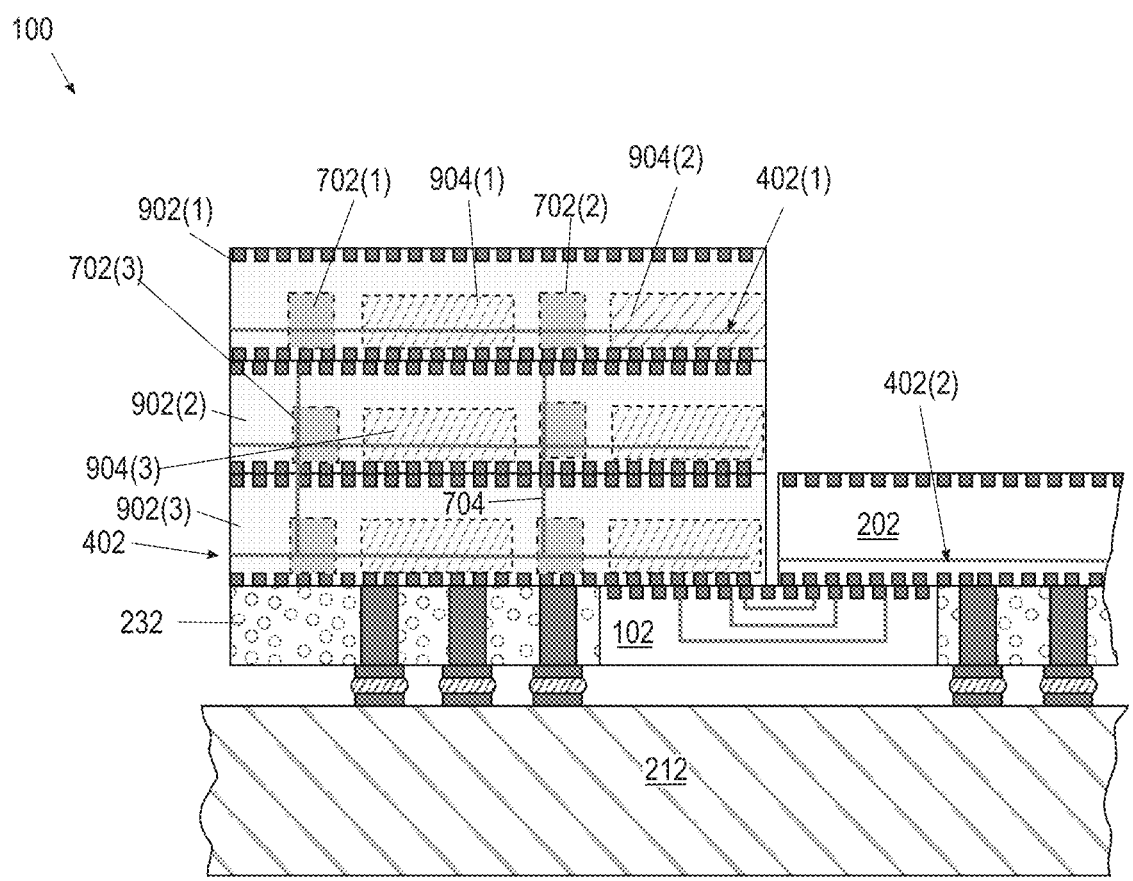
FIG. 12 is a simplified cross-sectional view of a network on chip in another example microelectronic assembly comprising IC dies made of more than one different process, according to embodiments of the present disclosure.

FIG. 12 is a simplified cross-sectional illustration of a portion of microelectronic assembly 100 comprising CMOS and beyond-CMOS dies according to various embodiments. NOC 402 may be realized with a structure as shown in the example embodiment. Beyond-CMOS die 902(1), beyond-CMOS die 902(2), and beyond-CMOS die 902(3) may be stacked one on top of another. Due to the low power consumption of beyond-CMOS dies, beyond-CMOS die 902(1), beyond-CMOS die 902(2), and beyond-CMOS die 902(3) may be stacked without encountering reliability problems due to heat dissipation. Each one of beyond-CMOS die 902(1), beyond-CMOS die 902(2), and beyond-CMOS die 902(3) may comprise one or more beyond-CMOS IP cores 904 therein, for example, 904(1), 904(2), 904(3) and so on. Beyond-CMOS die 902(1), beyond-CMOS die 902(2), and beyond-CMOS die 902(3) may also comprise router circuits 702, for intra-die routing and inter-die routing as needed. In some embodiments, more than one NOC may be provisioned in microelectronic assembly 100.

Base die 102 may function as a bridge, allowing coupling of beyond-CMOS die 902(3) with CMOS IP die 202 fabricated using traditional CMOS processes. Base die 102 may comprise appropriate circuit blocks, for example, level shifter, SerDes, voltage regulator, etc. that enable signals to be communicated seamlessly between beyond-CMOS die 902(1), beyond-CMOS die 902(2), and beyond-CMOS die 902(3) and IP die 202.

In some embodiments, beyond-CMOS dies 902 such as beyond-CMOS die 902(1), beyond-CMOS die 902(2), and beyond-CMOS die 902(3) may be provisioned in one NOC (e.g., 402(1)), whereas other dies, for example, CMOS IP die 202, may be provisioned in another parallel NOC (e.g., 402(2)). In other embodiments, beyond-CMOS dies 902 such as beyond-CMOS die 902(1), beyond-CMOS die 902(2), and beyond-CMOS die 902(3) and other die such as IP die 202 may be provisioned in same NOC 402. Any suitable network topology may be used in microelectronic assembly 100 within the broad scope of the embodiments. The availability of hybrid interconnects (e.g., metal-to-metal and oxide-to-oxide bonds) or equivalent can enable coupling of beyond-CMOS dies 902 and other dies such as CMOS IP die 202 in one NOC 402 in a compact, three-dimensional stack arrangement.

Figure 13:
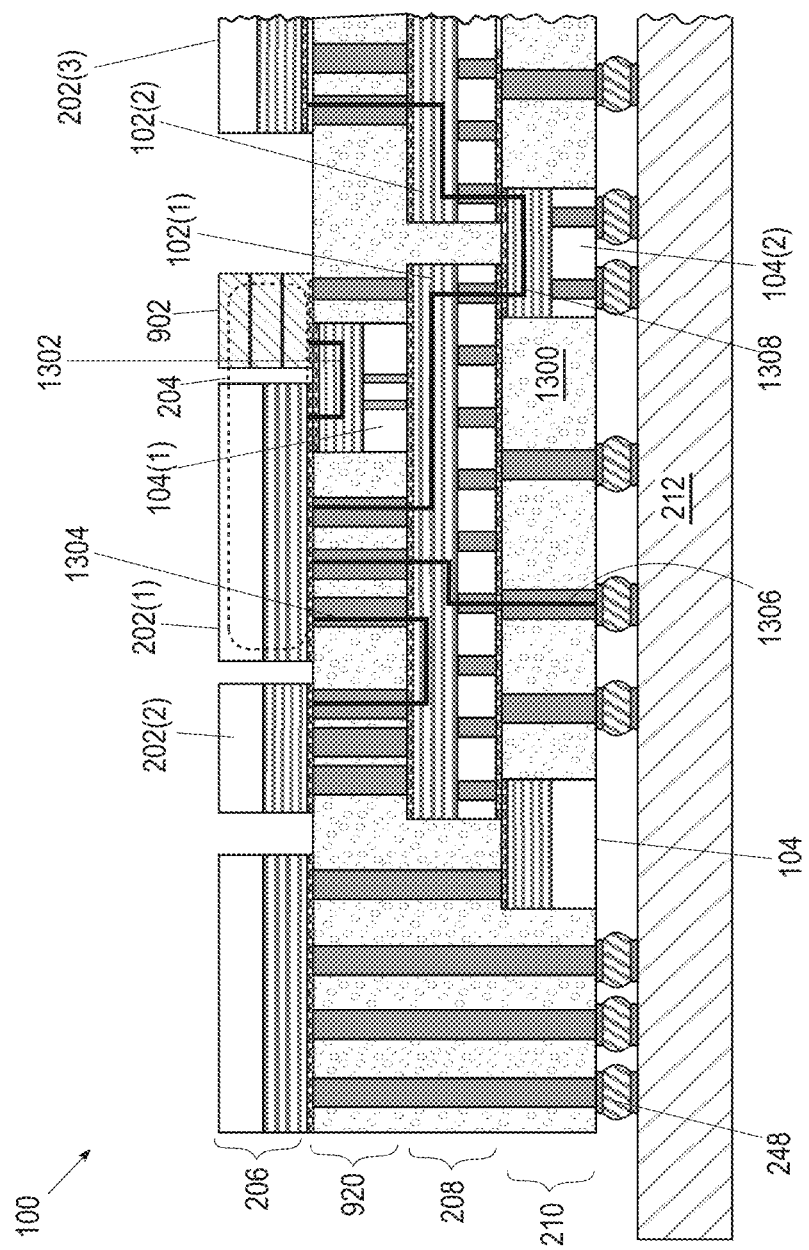
FIG. 13 is a simplified cross-sectional view of a network on chip in another example microelectronic assembly comprising IC dies made of more than one different process, according to embodiments of the present disclosure.

FIG. 13 is a simplified cross-sectional view of a portion of an example microelectronic package 100 comprising CMOS and beyond-CMOS dies according to various embodiments. The various IC dies, e.g., 102, 104, etc., may be embedded in a dielectric 1300 that spans more than one layer, for example, layers 206, 208, 210 and 920. Dielectric 1300 may comprise the same material as dielectric 232, or 244 in some embodiments. In other embodiments, dielectric 1300 may comprise a different material than dielectric 232 or 244. In yet other embodiments, each layer 206, 208, 210 and 920 may comprise a different material in dielectric 1300. Layer 920 may comprise bridge dies 104, similar to bridge dies 104 in layer 210. In the example embodiment shown, IP core 204 may be distributed across IP dies 202(1) and beyond-CMOS die 902 comprising a stack of beyond-CMOS dies. In an example embodiment, IP die 202(1) may comprise a processor circuitry, and beyond-CMOS die 902 may comprise a stack of mid-level cache (MLC). IP die 202(2) may comprise another processor circuitry, and IP die 202(3) may comprise a controller.

In the example embodiment shown, IP die 202(1) may be electrically coupled by an electrical pathway 1302 with beyond-CMOS die 902. Electrical pathway 1302 may not reach base die 102, and instead may be routed through bridge die 104(1) in layer 920. Routing through bridge die 104(1) without going through base die 102 may facilitate a shorter path between the portions of IP core 204 distributed across IP die 202(1) and beyond-CMOS die 902. Thus, in the example embodiment shown, bridge dies 104 in layer 920 may function as electrical bridges across adjacent IP dies (e.g., 202, 902) comprising portions of the same IP core 204 and situated over a single base die 102.

IP die 202(1) may be electrically coupled by another electrical pathway 1304 with IP die 202(2) through TDVs (in layer 920) and base die 102(1) (in layer 208). IP die 202(1) may be electrically coupled by yet another electrical pathway 1306 with package substrate 212. Electrical pathway 1306 may be routed through TDVs in layers 920 and 210 and base die 102(1) in layer 208. IP die 202(1) may be electrically coupled with IP die 202(3) through yet another electrical pathway 1308 that is routed through TDVs in layer 920, base die 102(1), bridge die 104(2) in layer 210 and base die 102(2) in layer 208. These few electrical pathways are shown and described merely for ease of explanation. Any number of such electrical pathways may be provisioned in microelectronic assembly 100 within the broad scope of the embodiments. The electrical pathways may comprise suitable routing through metallization stacks in IC dies, TDVs in dielectric, and/or TSVs in IC dies as appropriate and based on particular needs.

In various embodiments, the electrical pathways as described may form part of one or more NOC 402 in microelectronic assembly 100. For example, electrical pathway 1306 may be part of a global NOC 402(1); electrical pathway 1308 with IP die 202(3) may comprise part of another NOC 402(2); electrical pathway 1304 with IP die 202(2) over same base die 102(1) may comprise yet another NOC 402(3); and electrical pathway 1302 with beyond-CMOS die 902 may comprise yet another NOC 402(4); and so on.

In various embodiments, any of the features discussed with reference to any of FIGS. 1-12 herein may be combined with any other features to form a package with one or more IC dies as described herein, for example, to form a modified microelectronic assembly 100. Some such combinations are described above, but, in various embodiments, further combinations and modifications are possible.

Example Devices and Components

Figure 14:
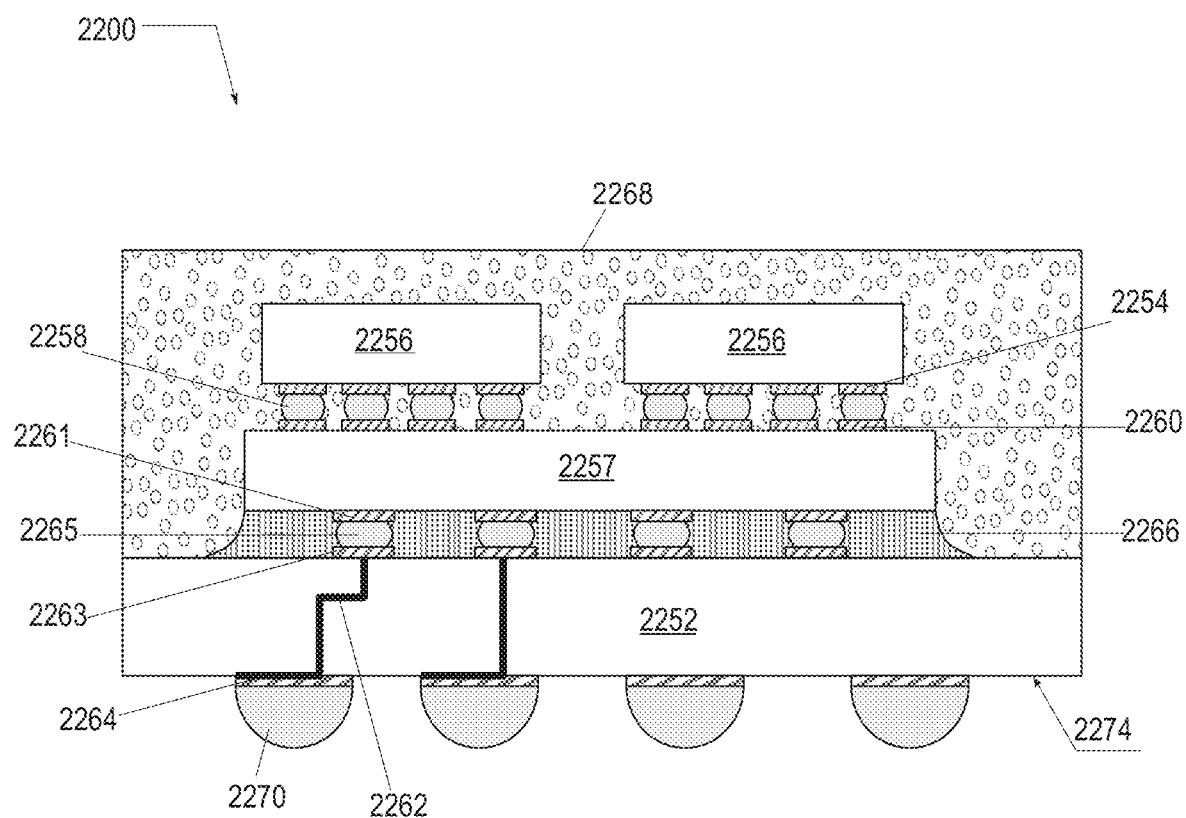
FIG. 14 is a cross-sectional view of a device package that includes one or more microelectronic assemblies in accordance with any of the embodiments disclosed herein.
Figure 15:
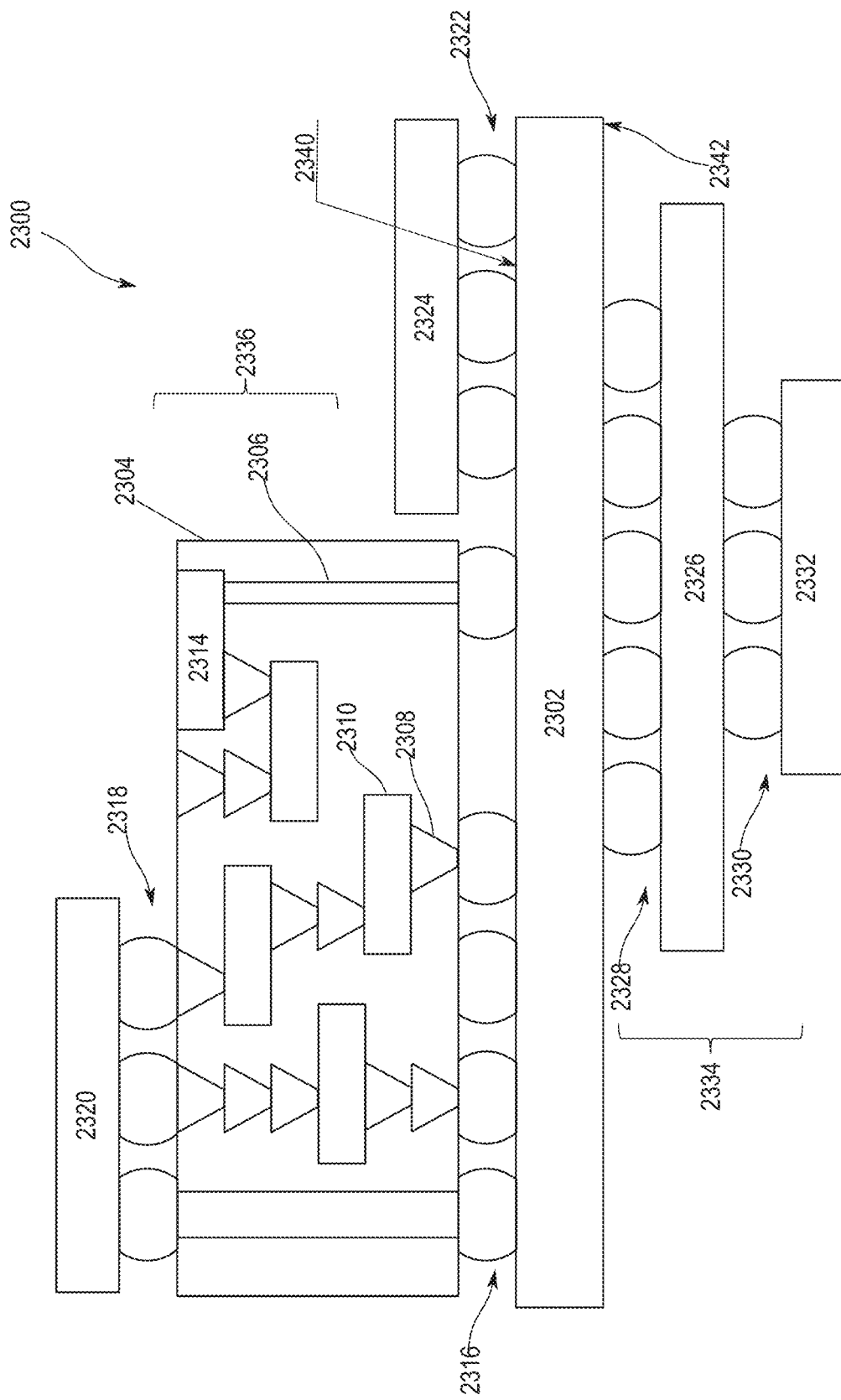
FIG. 15 is a cross-sectional side view of a device assembly that includes one or more microelectronic assemblies in accordance with any of the embodiments disclosed herein.
Figure 16:
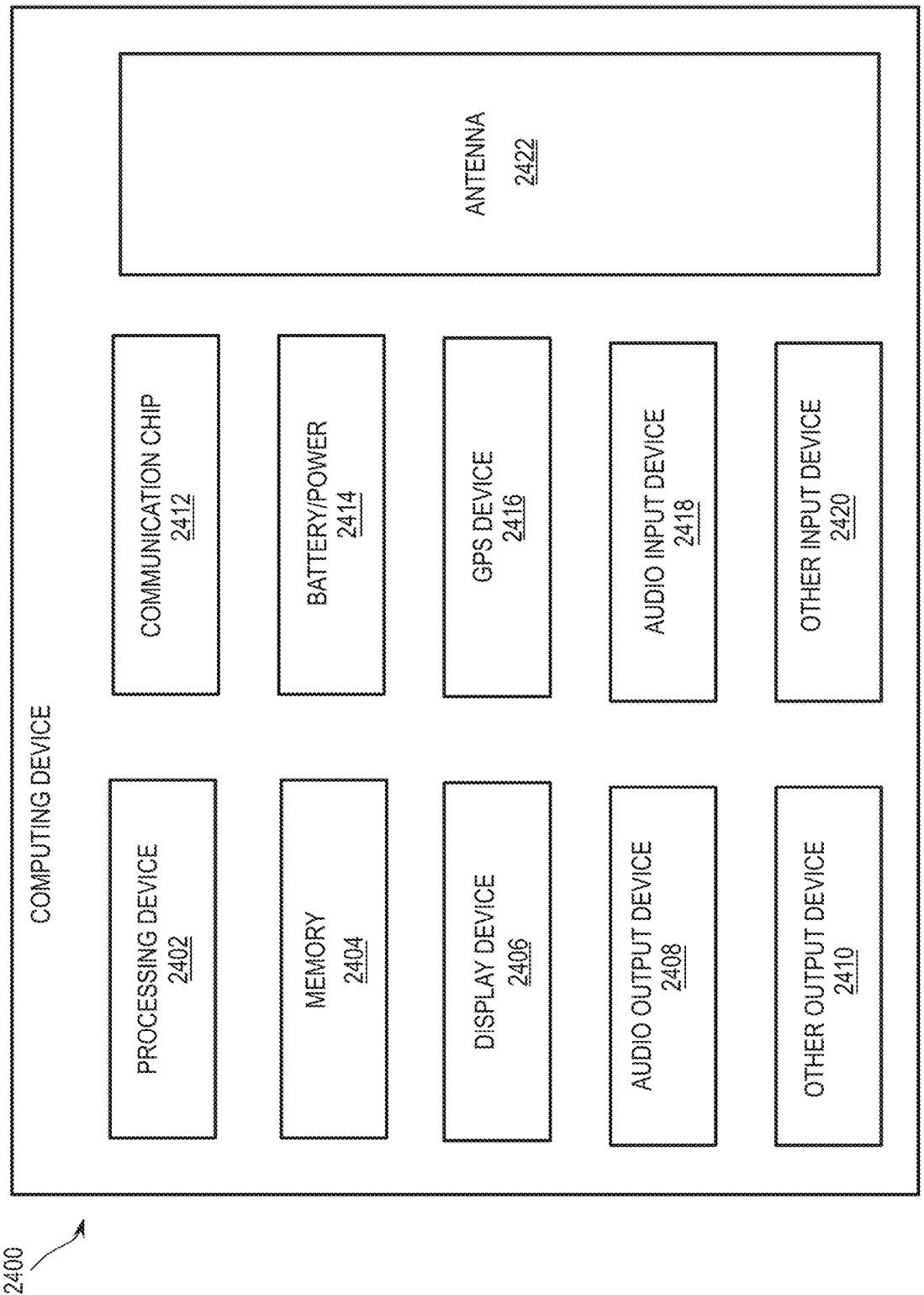
FIG. 16 is a block diagram of an example computing device that includes one or more microelectronic assemblies in accordance with any of the embodiments disclosed herein.

The packages disclosed herein, e.g., any of the embodiments shown in FIGS. 1-13 or any further embodiments described herein, may be included in any suitable electronic component. FIGS. 14-16 illustrate various examples of packages, assemblies, and devices that may be used with or include any of the IC packages as disclosed herein.

FIG. 14 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 15.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 15 is a cross-sectional side view of an IC device assembly 2300 that may include components having one or more microelectronic assembly 200 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 14.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 14. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 16 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 14). In yet another example, any one or more of the components of computing device 2400 may include an IC device assembly 2300 (e.g., as shown in FIG. 15).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides 1 a microelectronic assembly (e.g., 100, FIGS. 1-2B), comprising: a first plurality of IC dies (e.g., 202) in a first layer (e.g., 206); a second plurality of IC dies (e.g., 102) in a second layer (e.g., 208) between the first layer and a third layer (e.g., 210); and a third plurality of IC dies (e.g., 104) in the third layer, in which: the second plurality of IC dies comprises IC dies in an array of rows and columns (e.g., FIG. 1), each IC die of the second plurality of IC dies is coupled to more than one IC die of the first plurality of IC dies, and the third plurality of IC dies is to provide electrical coupling between adjacent ones of the second plurality of IC dies (e.g., FIG. 1).

Example 2 provides the microelectronic assembly of example 1, in which: the first plurality of IC dies comprises a first IC die having a first circuit, the second plurality of IC dies comprises a second IC die having a second circuit and a third IC die having a third circuit, the first circuit has a greater number of electrical connections with the second circuit than with the third circuit, and the first IC die is coupled to the second IC die with interconnects having a pitch of less than 10 micrometers between adjacent ones of the interconnects.

Example 3 provides the microelectronic assembly of example 1, in which: the first plurality of IC dies comprises a first IC die having a first circuit electrically coupled to a second circuit external to the first IC die, the second plurality of IC dies comprises a second IC die proximate to the second circuit, and a third IC die farther from the second circuit than the second IC die, and the first IC die is coupled to the second IC die by an electrical pathway from the first circuit to the second circuit that is shorter than another electrical pathway to the second circuit from the third IC die.

Example 4 provides the microelectronic assembly of example 1, in which: the first plurality of IC dies comprises a first IC die having a first IP core and a second IC die having a second IP core, the first IP core is conductively coupled with the second IP core, the second plurality of IC dies comprises a third IC die, and the first IC die and the second IC die are coupled to the third IC die with interconnects having a pitch of less than 10 micrometers between adjacent ones of the interconnects.

Example 5 provides the microelectronic assembly of any one of examples 1-4, in which the first plurality of IC dies comprises transistors that are smaller than transistors of the second plurality of IC dies.

Example 6 provides the microelectronic assembly of any one of examples 1-5, in which a first IC die of the first plurality of IC dies comprises transistors that are smaller than transistors in a second IC die of the first plurality of IC dies.

Example 7 provides the microelectronic assembly of example 6, in which: the first IC die does not comprise transistors having ferromagnetic materials, and the second IC die comprises transistors having ferromagnetic materials.

Example 8 provides the microelectronic assembly of example 6, in which the first IC die comprises transistors that are configured to operate at lower voltages than transistors in the second IC die.

Example 9 provides the microelectronic assembly of any one of examples 1-8, in which: IC dies of the second plurality of IC dies are substantially identical with each other in dimensions and circuits, and at least some IC dies of the first plurality of IC dies are not identical with each other in at least one of dimensions and circuits.

Example 10 provides the microelectronic assembly of any one of examples 1-9, in which: a first IC die has a first circuit with a first functionality, a second IC die has a second circuit with a second functionality, a first microprocessor having the first functionality and the second functionality includes the first IC die and the second IC die of the first plurality of IC dies, and a second microprocessor having the first functionality but not the second functionality includes the first IC die but not the second IC die of the first plurality of IC dies.

Example 11 provides the microelectronic assembly of example 10, in which the second plurality of IC dies is substantially identical in size, number, and circuits between the first microprocessor and the second microprocessor.

Example 12 provides the microelectronic assembly of example 11, in which the third plurality of IC dies is identical between the first microprocessor and the second microprocessor.

Example 13 provides the microelectronic assembly of any of examples 1-12, in which: interconnects at an interface between the first layer and the second layer are hybrid bonds distributed with interconnection density greater than 10,000 interconnections per square millimeter.

Example 14 provides the microelectronic assembly of example 13, in which: interconnects at another interface between the second layer and third layer are hybrid bonds distributed with interconnection density greater than 10,000 interconnections per square millimeter.

Example 15 provides the microelectronic assembly of any of examples 1-14, further comprising a network on chip (NOC), in which (e.g., FIG. 7) the NOC comprises: a plurality of router circuits conductively coupled by a plurality of conductors to IP cores of the first plurality of IC dies, in which: each IP core of the first plurality of IC dies is conductively coupled to at least one router circuit by one or more conductors in the plurality of conductors, and the plurality of router circuits is of the second plurality of IC dies.

Example 16 provides the microelectronic assembly of example 15, in which: the plurality of router circuits comprises a first plurality of router circuits, the plurality of conductors comprises a first plurality of conductors, and the NOC further comprises a second plurality of router circuits of the second plurality of IC dies, each IC die of the second plurality of IC dies comprising at least one router circuit of the second plurality of router circuits.

Example 17 provides the microelectronic assembly of any one of examples 1-16, in which IC dies of the first plurality of IC dies are of various shapes and sizes (e.g., FIGS. 3A-3B).

Example 18 provides the microelectronic assembly of any one of examples 1-16, in which IC dies of the first plurality of IC dies are similarly sized (e.g., FIG. 4).

Example 19 provides the microelectronic assembly of any one of examples 1-18, in which one of the IP cores comprises a central processor unit (CPU) core and another one of the IP cores comprises memory.

Example 20 provides the microelectronic assembly of any one of examples 1-19, in which one of the IP cores comprises a general-purpose processor circuitry and another one of the IP cores comprises an accelerator (e.g., FIGS. 4-6).

Example 21 provides the microelectronic assembly of example 20, in which (e.g., FIG. 4): the array comprises a first array, the first plurality of IC dies is in a second array over the first array, and IC dies in the second array are sized and shaped to fit within a boundary of the first array.

Example 22 provides the microelectronic assembly of example 21, in which: certain IC dies of the first plurality of IC dies are in a sub-array over a single one of the IC dies of the second plurality of IC dies, the certain IC dies in the sub-array are sized and shaped to fit within a boundary of the single one of the IC dies of the second plurality of IC dies.

Example 23 provides the microelectronic assembly of any one of examples 1-22, in which the second plurality of IC dies comprises a voltage regulator circuit (e.g., FIG. 9).

Example 24 provides the microelectronic assembly of any one of examples 1-23, in which the second plurality of IC dies comprises a serial-deserializer (SerDes) circuit and a level shifter (LS) circuit (e.g., FIG. 9).

Example 25 provides the microelectronic assembly of any one of examples 1-24, further comprising a fourth plurality of IC dies in a fourth layer (e.g., 920, FIG. 10), in which the fourth layer is between the first layer and the second layer.

Example 26 provides the microelectronic assembly of any one of examples 1-25, in which at least one IC die of the first plurality of IC dies comprises a stack of IC dies comprising transistors having a ferromagnetic material (e.g., FIG. 10).

Example 27 provides the microelectronic assembly of any one of examples 1-26, further comprising (e.g., FIG. 13): a fourth plurality of IC dies (e.g., 104) in a fourth layer (e.g., 920) between the first layer and the second layer, in which the fourth plurality of IC dies comprises conductive pathways between adjacent ones of the first plurality of IC dies.

Example 28 provides the microelectronic assembly of any one of examples 1-27, in which at least one IP core is distributed across multiple IC dies of the first plurality of IC dies.

Example 29 provides an IC package, comprising (e.g., FIG. 2B): a first IC die (e.g., 202) in a first layer (e.g., 206); a second IC die (e.g., 102) and a third IC die (e.g., 102) in a second layer (e.g., 208); a fourth IC die (e.g., 104) in a third layer (e.g., 210); and a package substrate (e.g., 212) coupled to the third layer, in which: the second layer is between the first layer and the third layer, the first IC die is attached to the second IC die, the third IC die is adjacent to the second IC die, and the fourth IC die comprises a conductive pathway between the second IC die and the third IC die.

Example 30 provides the IC package of example 29, in which: the second IC die comprises a circuit conductively coupled to one or more IP cores of the first plurality of IC dies.

Example 31 provides the IC package of example 30, in which at least one of the IP cores comprises a processor circuitry, and the circuit comprises a voltage regulator circuit.

Example 32 provides the IC package of any one of examples 29-31, in which the second IC die is identical in dimensions and circuitry with the third IC die.

Example 33 provides the IC package of any one of examples 29-32, in which the first IC die comprises transistors that are smaller than transistors in the second IC die.

Example 34 provides the IC package of any one of examples 29-33, in which the second IC die comprises a stacked plurality of IC dies, each IC die in the stacked plurality of IC dies comprising transistors having a ferromagnetic material (e.g., FIG. 11).

Example 35 provides the IC package of any one of examples 29-34, in which the first IC die comprises a stacked plurality of IC dies, each IC die in the stacked plurality of IC dies comprising transistors having a ferromagnetic material (e.g., FIGS. 9-10).

Example 36 provides the IC package of any one of examples 29-35, in which the fourth IC die does not comprise any diodes or transistors.

Example 37 provides the IC package of any one of examples 29-35, in which the fourth IC die comprises at least one of a diode and a transistor.

Example 38 provides the IC package of any one of examples 29-37, in which the second IC die, the third IC die and the fourth IC die comprise through-substrate vias (TSVs).

Example 39 provides the IC package of example 38, in which the TSVs are to carry power to the first IC die.

Example 40 provides the IC package of any one of examples 29-39, in which the fourth IC die is embedded in a dielectric material.

Example 41 provides the IC package of example 40, in which through-dielectric vias (TDVs) are in the dielectric material.

Example 42 provides the IC package of any one of examples 29-41, in which the second IC die and the third IC die are in a dielectric material.

Example 43 provides an arrangement of IC dies, comprising: a first plurality of IC dies comprising IC dies having IP cores; a second plurality of IC dies comprising IC dies, each of the IC dies of the second plurality of IC dies having at least one circuit conductively coupled to one or more of the IP cores; and a third plurality of IC dies comprising IC dies, each of the IC dies of the third plurality of IC dies comprising at least one conductive pathway between the second plurality of IC dies with interconnects having a pitch of less than 10 micrometers, in which: the first plurality of IC dies is in a first layer, the second plurality of IC dies is in a second layer, the second layer is between the first layer and a third layer, and the third plurality of IC dies is in the third layer.

Example 44 provides the arrangement of example 43, in which: the arrangement is a first arrangement of IC dies, the first plurality of IC dies comprises a first IC die having a first IP core at a location in the first layer, a second arrangement of IC dies is substantially identical to the first arrangement of IC dies in structure, except that a second IC die having a second IP core different from the first IP core is at the location in the first layer.

Example 45 provides the arrangement of any one of examples 43-44, in which the IC dies of the second plurality comprise a shared cache (e.g., 810) accessible by the first plurality of IC dies.

Example 46 provides the arrangement of any one of examples 43-45, in which the IC dies of the first plurality are coupled to the IC dies of the second plurality with interconnects having a pitch of less than 10 micrometers between adjacent ones of the interconnects.

Example 47 provides the arrangement of any one of examples 43-46, in which the IC dies of the second plurality are in a regular array of rows and columns.

Example 48 provides the arrangement of example 47, in which the IC dies of the second plurality are identical to each other in shape and circuitry.

Example 49 provides the arrangement of any one of examples 43-48, in which: the IP cores are conductively coupled to router circuits provisioned in the IC dies of the second plurality, and the router circuits are to route electrical signals between the IP cores.

Example 50 provides the arrangement of any one of examples 43-49, in which: a first portion of the IC dies of the first plurality comprises general-purpose processor circuitry, a second portion of the IC dies of the first plurality comprises accelerator circuitry, and the first portion and the second portion are in an array of rows and columns.

Example 51 provides the arrangement of any one of examples 43-50, in which the IC dies of the first plurality comprise transistors of a different size than transistors in the IC dies of the second plurality.

Example 52 provides the arrangement of example 51, in which the IC dies of the first plurality and the IC dies of the second plurality comprise transistors of different sizes than transistors in the IC dies of the third plurality.

Example 53 provides the arrangement of any one of examples 43-52, in which the IC dies of the third plurality do not include active circuit elements.

Example 54 provides a microelectronic assembly (e.g., 100, FIGS. 4-6) comprising: a first plurality of IC dies (e.g., 202) in a first layer (e.g., 206); a second plurality of IC dies (e.g., 102) in a second layer (e.g., 208); and a third plurality of IC dies (e.g., 104) in a third layer (e.g., 210), in which: the second layer is between the first layer and the third layer, a first portion (e.g., 202(1)) of the first plurality of IC dies comprises general-purpose processor circuitry (e.g., 404), a second portion (e.g., 202(2)) of the first plurality of IC dies comprises accelerator circuitry (e.g., 406), the first portion is physically mutually exclusive of the second portion, the second plurality of IC dies comprises IC dies that include circuitry conductively coupled to the general-purpose processor circuitry and the accelerator circuitry (e.g., FIG. 4), and the third plurality of IC dies comprises conductive pathways to provide electrical coupling between adjacent ones of the second plurality of IC dies (e.g., FIG. 6).

Example 55 provides the microelectronic assembly of example 54, in which: the first plurality of IC dies is in a first array of rows and columns, and the second plurality of IC dies is in a second array of rows and columns.

Example 56 provides the microelectronic assembly of any one of examples 54-55, in which IC dies of the first plurality are smaller than IC dies of the second plurality.

Example 57 provides the microelectronic assembly of any one of examples 54-56, in which each IC die of the first portion comprises one or more general-purpose processor circuitry and each IC die of the second portion comprises one or more accelerator circuitry.

Example 58 provides the microelectronic assembly of any one of examples 54-57, in which: the first portion of the first plurality of IC dies is coupled to a third portion of the second plurality of IC dies, and the second portion of the first plurality of IC dies is coupled to a fourth portion of the second plurality of IC dies.

Example 59 provides the microelectronic assembly of example 58, in which the third portion is physically mutually exclusive of the fourth portion.

Example 60 provides the microelectronic assembly of any one of examples 58-59, in which multiple ones of the IC dies of the first portion are contained over and within a footprint of a single one of the IC dies of the third portion.

Example 61 provides the microelectronic assembly of example 60, in which multiple ones of the IC dies of the second portion are contained over and within a footprint of a single one of the IC dies of the fourth portion.

Example 62 provides the microelectronic assembly of example 61, in which the single one of the IC dies of the third portion is a differently sized from the single one of the IC dies of the fourth portion.

Example 63 provides the microelectronic assembly of any one of examples 54-62, in which the IC dies of the second portion are scattered among the IC dies of the first portion.

Example 64 provides an IC package, comprising: a first IC die comprising a general-purpose processor circuitry; a second IC die comprising an accelerator circuitry; a third IC die comprising circuitry conductively coupled to the general-purpose processor circuitry; a fourth IC die comprising circuitry conductively coupled to the accelerator circuitry; and a fifth IC die comprising conductive pathways between the third IC die and the fourth IC die, in which: the first IC die and the second IC die are in a first layer, the third IC die and the fourth IC die are in a second layer, the second layer is between the first layer and a third layer, the fifth IC die is in the third layer, the first IC die is electrically and mechanically coupled to the third IC die, and the second IC die is electrically and mechanically coupled to the fourth IC die.

Example 65 provides the IC package of example 64, further comprising a plurality of first IC dies electrically and mechanically coupled to the third IC die with interconnects having a pitch of less than 10 micrometers between adjacent ones of the interconnects.

Example 66 provides the IC package of any one of examples 64-65, further comprising a plurality of second IC dies electrically and mechanically coupled to the fourth IC die with interconnects having a pitch of less than 10 micrometers between adjacent ones of the interconnects.

Example 67 provides the IC package of any one of examples 64-66, in which: the first IC die comprises transistors of a different size than transistors in the second IC die.

Example 68 provides the IC package of example 67, in which the third IC die comprises transistors of a different size than transistors in the fourth IC die.

Example 69 provides an arrangement of IC dies, comprising: general-purpose processor circuitry in a first plurality of IC dies; accelerator circuitry in a second plurality of IC dies; support circuitry in a third plurality of IC dies conductively coupled to the general-purpose processor circuitry and the accelerator circuitry; and a NOC comprising router circuits conductively coupled to the general-purpose processor circuitry and the accelerator circuitry, in which: the router circuits are in the IC dies of the third plurality, the accelerator circuitry are dispersed among the general-purpose processor circuitry, and conductive pathways between the general-purpose processor circuitry may not pass through the accelerator circuitry in some embodiments.

Example 70 provides the arrangement of example 69, comprising a fourth plurality of IC dies comprising conductive pathways between adjacent ones of the third plurality of base dies.

Example 71 provides the arrangement of any one of examples 69-70, in which: the NOC comprises a first NOC and a second NOC, the first NOC comprises a first portion of the router circuits, the second NOC comprises a second portion of the router circuits, the first portion of the router circuits is configured to conductively couple the general-purpose processor circuitry and the accelerator circuitry, and the second portion of the router circuits is configured to conductively couple the general-purpose processor circuitry among themselves.

Example 72 provides the arrangement of any one of examples 69-71, in which: the first plurality of IC dies and the second plurality of IC dies are coplanar in a first layer, the third plurality of IC dies is in a second layer, the second layer is not coplanar with the first layer, and the first layer is electrically and mechanically coupled to the second layer with interconnects having a pitch of less than 10 micrometers between adjacent ones of the interconnects.

Example 73 provides the arrangement of any one of examples 69-72, in which the support circuitry comprises a first set of support circuitry conductively coupled to the general-purpose processor circuitry and a second set of support circuitry conductively coupled to the accelerator circuitry.

Example 74 provides a microelectronic assembly, comprising (e.g., FIGS. 7A-8B; FIGS. 11, 12): a first plurality of IC dies (e.g., 202) in a first layer (e.g., 206); a second plurality of IC dies (e.g., 102) in a second layer (e.g., 208); a third plurality of IC dies (e.g., 104) in a third layer (e.g., 210); and a network-on-chip (NOC) spanning the microelectronic assembly, the NOC comprising a plurality of conductively coupled router circuits, in which: the second layer is between the first layer and the third layer, the first plurality of IC dies comprises IP cores conductively coupled through the router circuits (e.g., FIG. 7A), the router circuits are of the second plurality of IC dies (e.g., FIG. 8A), and the third plurality of IC dies comprises conductive pathways between adjacent ones of the second plurality of IC dies.

Example 75 provides the microelectronic assembly of example 74, in which: IP cores of the first plurality of IC dies are coupled to the router circuits by links, each link comprises a number of interconnections between the first plurality of IC dies and the second plurality of IC dies, a first IC die having an IP core using higher bandwidth than another IP core in a second IC die has greater number of interconnections per link than the second IC die, and a third IC die of the first plurality of IC dies larger than a fourth IC die of the first plurality of IC dies has a greater number of interconnections per link than the fourth IC die.

Example 76 provides the microelectronic assembly of any one of examples 74-75, in which (e.g., FIG. 7B): the NOC comprises a first NOC, a second NOC, and a third NOC, the first NOC has a first plurality of router circuits conductively coupled to IC dies of the second plurality of IC dies, the second NOC has a second plurality of router circuits conductively coupled to IC dies of the first plurality of IC dies, and the third NOC has a third plurality of router circuits conductively coupled to IP cores within an IC die of the first plurality of IC dies.

Example 77 provides the microelectronic assembly of example 76, in which each IC die of the second plurality of IC dies comprises a separate one of the second NOC.

Example 78 provides the microelectronic assembly of any one of examples 76-77, in which each IC die of the first plurality of IC dies comprises a separate one of the third NOC.

Example 79 provides the microelectronic assembly of any one of examples 74-78, in which (e.g., FIG. 7A) the NOC comprises a first NOC having a first plurality of router circuits, and a parallel second NOC having a second plurality of router circuits.

Example 80 provides the microelectronic assembly of any one of examples 74-79, in which (e.g., FIG. 8A): IP cores of the first plurality of IC dies are coupled to the router circuits by links (e.g., 704), each link comprising a number of interconnections between the first plurality of IC dies and the second plurality of IC dies, and at least two links are conductively coupled together at a node, a first node of the NOC is coupled to at least one of: a first interconnection (e.g., 804), a second interconnection (e.g., 806) and a third interconnection (e.g., 808), the first interconnection is configured to conductively couple the first node with a second node of the NOC, the second interconnection is configured to conductively couple the first node with a third node of another NOC, the third interconnection is configured to conductively couple the first node with a fourth node of the NOC, the first node, the second node, and the third node are in the second layer, and the fourth node is in the first layer.

Example 81 provides the microelectronic assembly of example 80, in which the first interconnection and the third interconnection form part of a link (e.g., 704) in the NOC.

Example 82 provides the microelectronic assembly of example 80, in which the second interconnection forms part of a link (e.g., 706) connecting the NOC with the another NOC.

Example 83 provides the microelectronic assembly of any one of examples 80-82, in which (e.g., FIG. 8C): the first interconnection and the second interconnection comprise conductive pathways in at least one of the second layer and the third layer, and the third interconnection comprises one or more die-to-die (DTD) interconnects between the first layer and the second layer.

Example 84 provides the microelectronic assembly of any one of examples 80-83, in which: the first node is in at least one of the second plurality of IC dies and the third plurality of IC dies, and the fourth node is of the first plurality of IC dies.

Example 85 provides the microelectronic assembly of any one of examples 74-84, in which: a cache is distributed among the second plurality of IC dies, and the cache is conductively coupled to the IP cores by the nodes, links and router circuits of the NOC.

Example 86 provides the microelectronic assembly of any one of examples 74-85, in which at least one of the first plurality of IC dies and the second plurality of IC dies comprises a stack of IC dies comprising transistors with ferromagnetic materials.

Example 87 provides the microelectronic assembly of example 86, in which a link in the NOC coupling an IC die having transistors with ferromagnetic material with another IC die comprising voltage regulation circuitry, voltage level shifting circuitry, and frequency conversion circuitry.

Example 88 provides an IC package, comprising (e.g., FIG. 8C): a first IC die, a second IC die, and a third IC die in a first layer; a first IP core in the first IC die, a second IP core in the second IC die, a third IP core in the third IC die, and a fourth IP core in the third IC die; a fourth IC die and a fifth IC die in a second layer; a sixth IC die in a third layer; a package substrate coupled to the third layer; and a network-on-chip (NOC) coupling the first IP core, the second IP core, the third IP core, and the fourth IP core, in which: the second layer is between the first layer and the third layer, the NOC comprises a plurality of conductively coupled router circuits, the first IC die and the second IC die are attached to the fourth IC die, the third IC die is attached to the fifth IC die, and the sixth IC die comprises conductive pathways between the fourth IC die and the fifth IC die.

Example 89 provides the IC package of example 88, in which: the NOC comprises a first NOC, and a second NOC, the first NOC has a first plurality of router circuits conductively coupled to the first IP core and the second IP core with the third IP core through the fourth IC die and the fifth IC die, and the second NOC has a second plurality of router circuits conductively coupled to the first IP core with the second IP core through the fourth IC die.

Example 90 provides the IC package of example 89, further comprising a fourth IP core in the third IC die, in which: the NOC further comprises a third NOC, and the third NOC has a third plurality of router circuits conductively coupled to the third IP core and the fourth IP core.

Example 91 provides the IC package of any one of examples 88-90, in which the plurality of router circuits are in the second layer and conductively coupled together in a mesh network (e.g., FIG. 8A).

Example 92 provides the IC package of example 91, in which a plurality of conductors couple the plurality of router circuits, each conductive coupling between any two router circuit being a link in the mesh network, each link comprising conductive joints and interconnections through the first layer, the second layer and the third layer.

Example 93 provides the IC package of any one of examples 88-92, in which the third IC die comprises a stack of IC dies having transistors with ferromagnetic materials.

Example 94 provides the IC package of example 93, in which the third IP core is in one of the IC dies in the stack of IC dies, and the fourth IP core is in another one of the IC dies in the stack of IC dies.

Example 95 provides the IC package of example 94, in which the third IP core comprises a cache and the fourth IP core comprises a processor circuitry.

Example 96 provides the IC package of any one of examples 88-95, in which the fourth IP die comprises a stack of IC dies having transistors with ferromagnetic materials coupled with DTD interconnects having a pitch of less than 10 micrometers.

Example 97 provides the IC package of any one of examples 88-96, in which: a cache is distributed across the fourth IC die and the fifth IC die in the second layer, and the cache is conductively coupled to the first IP core, the second IP core, and the third IP core.

Example 98 provides an arrangement of IC dies, comprising: IP cores in a first plurality of IC dies in a first layer; and router circuits in a second plurality of IC dies in a second layer, the second layer not coplanar with the first layer, in which each IP core is conductively coupled over a NOC to one of the router circuits by one or more conductors.

Example 99 provides the arrangement of example 98, in which: the NOC comprises a first NOC coupling a first portion of the IP cores by a first plurality of router circuits, and the NOC comprises a second NOC coupling a second portion of the IP cores by a second plurality of router circuits.

Example 100 provides the arrangement of any one of examples 98-99, in which at least one of the first plurality of IC dies and the second plurality of IC dies comprises a stack of IC dies having transistors with ferromagnetic materials.

Example 101 provides the arrangement of any one of examples 98-100, in which the router circuits (e.g., 702) are distributed of the second plurality of IC dies.

Example 102 provides the arrangement of any one of examples 98-101, further comprising a cache (e.g., 810) distributed of the second plurality of IC dies, in which the cache is conductively coupled over the NOC by the IP cores of the first plurality of IC dies.

Example 103 provides the arrangement of any one of examples 98-102, in which the NOC comprises a mesh topology, comprising: a first plurality of conductors; and a second plurality of conductors, in which: each of the second plurality of conductors intersects at least one of the first plurality of conductors, forming a plurality of network nodes, each of the network node is at an intersection of one of the first plurality of conductors with one of the second plurality of conductors, and each of the first plurality of conductors is disposed orthogonally to each of the second plurality of conductors.

Example 104 provides a microelectronic assembly, comprising (e.g., FIG. 9): a plurality of IC dies in a first layer and a second layer, in which: the first layer and the second layer are not coplanar, the first layer and the second layer are coupled electrically and mechanically with interconnects having a pitch of less than 10 micrometers between adjacent ones of the interconnects, a first IC die in the plurality of IC dies does not comprise transistors having a ferromagnetic material, and a second IC die in the plurality of IC dies comprises transistors having a ferromagnetic material.

Example 105 provides the microelectronic assembly of example 104, in which: the first IC die is coupled to the second IC die, and the first IC die comprises circuits for voltage conversion, frequency shifting and voltage regulation.

Example 106 provides the microelectronic assembly of example 105, in which: the circuit for voltage conversion is configured to shift voltage between a first voltage level and a second voltage level, the first IC die is configured to operate at the first voltage level and the second IC die is configured to operate at the second voltage level, and the first voltage level is higher than the second voltage level.

Example 107 provides the microelectronic assembly of any one of examples 105-106, in which: the circuit for frequency shifting comprises a circuit to change a frequency of a signal between a first frequency and a second frequency, the first IC die is configured to operate on signals at the first frequency and the second IC die is configured to operate on signals at the second frequency, and the first frequency is higher than the second frequency.

Example 108 provides the microelectronic assembly of example 107, in which: a first number of interconnects is for the signals at the first frequency, a second number of interconnects is for the signals at the second frequency, the first number is smaller than the second number, and the second number of interconnects have a pitch of less than 10 micrometers between adjacent ones of the second number of interconnects.

Example 109 provides the microelectronic assembly of any one of examples 105-108, in which the first IC die is in the first layer and the second IC die is in the second layer.

Example 110 provides the microelectronic assembly of example 109, in which the first IC die comprises conductive pathways between the second IC die and other IC dies in the plurality of IC dies.

Example 111 provides the microelectronic assembly of any one of examples 109-110, in which the first IC die comprises circuitry conductively coupled to IP cores (e.g., 904) in the second IC die.

Example 112 provides the microelectronic assembly of any one of examples 104-111, further comprising a third IC die in the plurality of IC dies, in which: the third IC die comprises circuitry configured to operate at a voltage less than or equal to 0.35 V.

Example 113 provides the microelectronic assembly of any one of examples 104-112, in which the first IC die comprises a general-purpose processor circuitry and the second IC die comprises an accelerator.

Example 114 provides the microelectronic assembly of any one of examples 104-113, further comprising a stack of IC dies comprising transistors with ferromagnetic materials in the plurality of IC dies.

Example 115 provides the microelectronic assembly of example 114, in which the stack of IC dies functions comprises circuitry conductively coupled to IP cores of the first IC die and the second IC die.

Example 116 provides the microelectronic assembly of any one of examples 104-115, in which: IC dies in the second layer are in an array of rows and columns, the IC dies in the second layer comprise circuitry conductively coupled to IC dies in the first layer, the IC dies in the first layer comprise IP cores, and the IC dies in the second layer comprise router circuits of a NOC to facilitate communication among the IP cores.

Example 117 provides the microelectronic assembly of example 116, in which: the first IC die is in the first layer, and the second IC die is in the second layer.

Example 118 provides the microelectronic assembly of example 116, in which: the second IC die is in the first layer, and the first IC die is in the second layer.

Example 119 provides the microelectronic assembly of any one of examples 116-118, in which the IC dies in the second layer comprise a distributed cache conductively coupled to the IC dies in the first layer.

Example 120 provide an IC package, comprising: a first IC die in a first layer; a second IC die in a second layer; a third IC die in a third layer; and a package substrate coupled to the third layer, in which: the second layer is between the first layer and the third layer, interconnects between the first layer and the second layer comprise interconnects having a pitch of less than 10 micrometers between adjacent ones of the interconnects, one of the first IC die and the second IC die comprises transistors having a ferromagnetic material, and the other of the first IC die and the second IC die comprises a first circuit for voltage conversion, a second circuit for frequency shifting and a third circuit for voltage regulation.

Example 121 provides the IC package of example 120, in which the second IC die comprises circuitry conductively coupled to one or more IP cores in the first IC die.

Example 122 provides the IC package of any one of examples 120-121, in which the third circuit for voltage regulation provides power at a voltage level at which the one of the first IC die and the second IC die comprising transistors having a ferromagnetic material is configured to operate.

Example 123 provides the IC package of any one of examples 120-122, in which: the first circuit for voltage conversion is configured to shift voltage between a first voltage level and a second voltage level, the first voltage level is higher than the second voltage level, the one of the first IC die and the second IC die comprising transistors having a ferromagnetic material configured to operate at the second voltage level, and the other of the first IC die and the second IC die is configured to operate at the first voltage level.

Example 124 provides the IC package of any one of examples 120-123, in which: the second circuit for frequency shifting comprises a circuit that changes a frequency of a signal between a first frequency and a second frequency, the first frequency is higher than the second frequency, the one of the first IC die and the second IC die comprising transistors having a ferromagnetic material is configured to operate on signals at the second frequency, and the other of the first IC die and the second IC die is configured to operate on signals at the first frequency.

Example 125 provides the IC package of any one of examples 120-124, in which the third IC die comprises conductive pathways between the second IC die to adjacent IC dies in the second layer.

Example 126 provides the IC package of any one of examples 120-125, in which the one of the first IC die and the second IC die comprising transistors having a ferromagnetic material is a stack of IC dies.

Example 127 provides the IC package of any one of examples 120-126, in which the one of the first IC die and the second IC die comprising transistors having a ferromagnetic material generates less heat than the other of the first IC die and the second IC die.

Example 128 provides an arrangement of IC dies, comprising: a plurality of IP cores distributed across at least a first layer and a second layer; router circuits conductively coupled to the plurality of IP cores; and circuitry distributed in an array of IC dies and conductively coupled to the plurality of IP cores and the router circuits, in which: the first layer and the second layer are not coplanar, at least one IP core in the plurality of IP cores comprises transistors having a ferromagnetic material, and the router circuits are distributed in the array of IC dies.

Example 129 provides the arrangement of example 128, in which at least one in the plurality of IP cores comprises a general-purpose processor circuitry and at least another one in the plurality of IP cores comprises an accelerator circuitry.

Example 130 provides the arrangement of any one of examples 128-129, in which the at least one IP core comprising transistors having a ferromagnetic material comprises at least one of a memory, an accelerator circuitry, and a general-purpose processor circuitry.

Example 131 provides the arrangement of any one of examples 128-130, in which at least one of the IC dies in the array comprises transistors having a ferromagnetic material.

Example 132 provides the arrangement of any one of examples 128-131, in which one of the IC dies in the array is coupled to the at least one IP core comprising transistors having a ferromagnetic material, comprises circuits for voltage conversion, frequency shifting and voltage regulation.

Example 133 provides the arrangement of any one of examples 128-132, in which a cache conductively coupled to the plurality of IP cores is distributed among the array of IC dies.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a first plurality of integrated circuit (IC) dies in a first layer, wherein:
the first plurality of IC dies comprises a first IC die, and
the first IC die comprises first conductive contacts at a first face of the first IC die;
a second plurality of IC dies in a second layer between the first layer and a third layer, wherein:
the second plurality of IC dies is in an array of rows and columns, wherein the second plurality of IC dies comprises a second IC die and a third IC die,
the second IC die comprises second conductive contacts at a second face of the second IC die,
the third IC die comprises third conductive contacts at a third face of the third IC die, and
the first conductive contacts are coupled with the second conductive contacts at a first bonding interface between the first face of the first IC die and the second face of the second IC die; and
a third plurality of IC dies in the third layer, wherein:
the third plurality of IC dies is to provide electrical coupling between adjacent ones of the second plurality of IC dies,
the third plurality of IC dies comprises a fourth IC die,
the fourth IC die comprises fourth conductive contacts and fifth conductive contacts at a fourth face of the fourth IC die,
the fourth conductive contacts are coupled with corresponding conductive contacts at a second bonding interface between the fourth face of the fourth IC die and a face of the second IC die opposite the second face, and
the fifth conductive contacts are coupled with the third conductive contacts at a third bonding interface between the fourth face of the fourth IC die and the third face of the third IC die.

2. The microelectronic assembly of claim 1, wherein:
the first IC die comprises a first circuit,
the second IC die comprises a second circuit and the third IC die comprises a third circuit,
the first circuit has a greater number of electrical connections with the second circuit than with the third circuit, and
the first IC die is coupled to the second IC die with interconnects having a pitch of less than 10 micrometers between adjacent ones of the interconnects.

3. The microelectronic assembly of claim 1, wherein:
the first IC die comprises a first circuit electrically coupled to a second circuit external to the first IC die,
the second IC die is proximate to the second circuit, and the third IC die is farther from the second circuit than the second IC die, and
the first IC die is coupled to the second IC die by an electrical pathway from the first circuit to the second circuit that is shorter than another electrical pathway to the second circuit from the third IC die.

4. The microelectronic assembly of claim 1, wherein:
the first plurality of IC dies comprises a first IC die having a first intellectual property (IP) core and a an additional IC die having a second IP core,
the first IP core is conductively coupled with the second IP core,
the second plurality of IC dies comprises the second IC die, and
the first IC die and the additional IC die are coupled to the second IC die with interconnects having a pitch of less than 10 micrometers between adjacent ones of the interconnects.

5. The microelectronic assembly of claim 1, whereof the first plurality of IC dies comprises transistors that are smaller than transistors of the second plurality of IC dies.

6. The microelectronic assembly of claim 1, wherein the first IC die of the first plurality of IC dies comprises transistors that are smaller than transistors in the second IC die of the first plurality of IC dies.

7. The microelectronic assembly of claim 6, wherein the first IC die does not comprise transistors having ferromagnetic materials, and the second IC die comprises transistors having ferromagnetic materials.

8. The microelectronic assembly of claim 1, further comprising a network on chip (NOC), wherein the NOC comprises:
a plurality of router circuits conductively coupled by a plurality of conductors to IP cores of the first plurality of IC dies, wherein:
each IP core of the first plurality of IC dies is conductively coupled to at least one router circuit by one or more conductors in the plurality of conductors, and
the plurality of router circuits is in the second plurality of IC dies.

9. An IC package, comprising:
a first IC die in a first layer;
a second IC die and a third IC die in a second layer;
a fourth IC die in a third layer; and
a package substrate coupled to the third layer,
wherein:
the second layer is between the first layer and the third layer,
the first IC die is attached to the second IC die via a first hybrid bonding interface between first conductive contacts of the first IC die and second conductive contacts of the second IC die,
the third IC die is adjacent to the second IC die,
the fourth IC die comprises a conductive pathway between the second IC die and the third IC die,
the second IC die is attached to the fourth IC die via a second hybrid bonding interface between third conductive contacts of the second IC die and fourth conductive contacts of the fourth IC die, and
the third IC die is attached to the fourth IC die via a third hybrid bonding interface between fifth conductive contacts of the third IC die and sixth conductive contacts of the fourth IC die.

10. The IC package of claim 9, wherein: the second IC die comprises a circuit conductively coupled to one or more IP cores of a first plurality of IC dies of the first layer.

11. The IC package of claim 10, wherein at least one of the IP cores comprises a processor circuitry, and the circuit comprises a voltage regulator circuit.

12. The IC package of claim 9, wherein the second IC die comprises a stacked plurality of IC dies, each IC die in the stacked plurality of IC dies comprising transistors having a ferromagnetic material.

13. The IC package of claim 9, wherein the fourth IC die lacks transistors.

14. The IC package of claim 9, wherein the second IC die, the third IC die and the fourth IC die comprise through-substrate vias (TSVs).

15. The IC package of claim 9, wherein the fourth IC die is embedded in a dielectric material.

16. The IC package of claim 15, wherein through-dielectric vias (TDVs) are in the dielectric material.

17. An arrangement of IC dies, comprising:
- a first plurality of IC dies comprising IC dies having IP cores, the first plurality of IC dies comprising a first IC die;
- a second plurality of IC dies comprising a second IC die and a third IC die wherein the second IC die comprises at least one circuit conductively coupled to one or more of the IP cores;
- a third plurality of IC dies comprising a fourth IC die, wherein the fourth IC die comprises at least one conductive pathway between the second plurality of IC dies with interconnects having a pitch of less than 10 micrometers, wherein:
- the first plurality of IC dies is in a first layer,
- the second plurality of IC dies is in a second layer,
- the second layer is between the first layer and a third layer, and
- the third plurality of IC dies is in the third layer;
- a first bonding interface between first conductive contacts of the first IC die and second conductive contacts of a second IC die;
- a second bonding interface between third conductive contacts of the second IC die and fourth conductive contacts of the fourth IC die; and
- a third bonding interface between fifth conductive contacts of the third IC die and sixth conductive contacts of the fourth IC die.

18. The arrangement of claim 17, wherein the IC dies of the second plurality comprise a shared cache accessible by the first plurality of IC dies.

19. The arrangement of claim 17, wherein the IC dies of the first plurality are coupled to the IC dies of the second plurality with interconnects having a pitch of less than 10 micrometers between adjacent ones of the interconnects.

20. The arrangement of claim 17, wherein the IC dies of the second plurality are in a regular array of rows and columns.

* * * * *

UNITED STATES PATENT AND TRADEMARK OFFICE
CERTIFICATE OF CORRECTION

| | | |
|---|---|---|
| PATENT NO. | : 12,469,820 B2 | Page 1 of 1 |
| APPLICATION NO. | : 17/548304 | |
| DATED | : November 11, 2025 | |
| INVENTOR(S) | : Carleton L. Molnar et al. | |

It is certified that error appears in the above-identified patent and that said Letters Patent is hereby corrected as shown below:

In the Claims

In Column 58, Claim 4, Line 5, delete "a an" and insert -- an --, therefor.

In Column 58, Claim 5, Line 15, delete "whereof" and insert -- wherein --, therefor.

Signed and Sealed this
Twenty-third Day of December, 2025

John A. Squires
*Director of the United States Patent and Trademark Office*